United States Patent

Iwasaki et al.

[11] Patent Number: 5,100,276
[45] Date of Patent: Mar. 31, 1992

[54] PRODUCTION SYSTEM USING WAFER-LIKE CARRIER JIG

[75] Inventors: Takemasa Iwasaki, Yokohama; Sadao Shimoyashiro, Fujisawa; Haruo Ohya, Yokohama; Hiroshi Kikuchi, Kanagawa; Tsutomu Takahashi; Masahiro Watanabe, both of Yokohama, all of Japan

[73] Assignee: Hitachi, Ltd., Tokyo, Japan

[21] Appl. No.: 231,160

[22] Filed: Aug. 11, 1988

[30] Foreign Application Priority Data

Aug. 12, 1987 [JP] Japan .................. 62-199739

[51] Int. Cl.$^5$ .................. H01L 21/68; B65G 15/60; B65G 47/90
[52] U.S. Cl. .................. 414/222; 414/416; 220/4.26; 198/346.1; 198/347.4; 198/349.7
[58] Field of Search .................. 414/217, 222, 225, 226, 414/331, 403, 416; 220/4 C, 4 D, 23.83; 206/328; 118/500, 719; 198/346.1, 347.4, 349.6, 349.7, 465.1

[56] References Cited

U.S. PATENT DOCUMENTS

| | | | |
|---|---|---|---|
| 3,576,540 | 4/1971 | Fair et al. .................. | 198/346.1 X |
| 3,648,819 | 3/1972 | Converse, III et al. .................. | 198/346.1 |
| 3,796,327 | 3/1974 | Meyer et al. .................. | 198/346.1 X |
| 3,889,797 | 6/1975 | Naito et al. .................. | 198/346.1 |
| 4,120,629 | 10/1978 | Christian et al. .................. | 198/349.6 X |
| 4,178,113 | 12/1979 | Beaver, II et al. .................. | 414/416 X |
| 4,244,672 | 1/1981 | Lund .................. | 198/349.7 X |
| 4,293,249 | 10/1981 | Whelan .................. | 414/217 X |
| 4,614,474 | 9/1986 | Sudo .................. | 414/416 X |
| 4,682,927 | 7/1987 | Southworth et al. .................. | 414/217 |
| 4,701,096 | 10/1987 | Fisher, Jr. .................. | 414/331 X |
| 4,722,298 | 2/1988 | Rubin et al. .................. | 414/222 X |
| 4,722,653 | 2/1988 | Williams et al. .................. | 198/346.1 X |
| 4,722,659 | 2/1988 | Hoyt, III et al. .................. | 414/416 |
| 4,802,094 | 1/1989 | Nakamura et al. .................. | 198/349.7 |
| 4,803,373 | 2/1989 | Imamura et al. .................. | 414/331 X |
| 4,805,759 | 2/1989 | Rochet et al. .................. | 198/346.1 |
| 4,818,169 | 4/1989 | Schram, deceased et al. .................. | 414/217 X |
| 4,824,309 | 4/1989 | Kakehi et al. .................. | 414/217 |
| 4,886,412 | 12/1989 | Wooding et al. .................. | 414/217 X |
| 4,917,556 | 4/1990 | Stark et al. .................. | 414/222 X |
| 4,932,828 | 6/1990 | Katae et al. .................. | 414/416 X |

FOREIGN PATENT DOCUMENTS

| | | | |
|---|---|---|---|
| 1169694 | 7/1962 | Fed. Rep. of Germany ... | 220/23.83 |
| 3338994 | 5/1984 | Fed. Rep. of Germany ...... | 414/331 |
| WO86/06245 | 10/1986 | Fed. Rep. of Germany ...... | 414/222 |
| 3603534 | 8/1987 | Fed. Rep. of Germany ... | 198/346.1 |
| 57-19219 | 2/1982 | Japan .................. | 414/331 |
| 59-213142 | 12/1984 | Japan . | |
| 60-176547 | 11/1985 | Japan . | |
| 60-229347 | 11/1985 | Japan . | |
| 60-229348 | 11/1985 | Japan . | |
| 60-252535 | 12/1985 | Japan .................. | 414/331 |
| 61-23002 | 1/1986 | Japan .................. | 198/346.1 |
| 61-291335 | 12/1986 | Japan .................. | 414/331 |
| 63-18855 | 4/1988 | Japan . | |

*Primary Examiner*—Robert J. Spar
*Assistant Examiner*—Robert S. Katz
*Attorney, Agent, or Firm*—Fay, Sharpe, Beall, Fagan, Minnich & McKee

[57] ABSTRACT

The present invention provides a carrier jig for use in processing, transporting and stocking a wafer-like material used in manufacture processes of semiconductor products, and a semiconductor production system using the carrier jig. The carrier jig of the present invention comprises a holder for holding and storing therein one wafer, for example, and a container box for loading therein the holder. A mechanism for transferring wafers by the use of the carrier jig is provided in each process, with the result the period of production time can be shortened and the production speed can be enhanced.

1 Claim, 25 Drawing Sheets

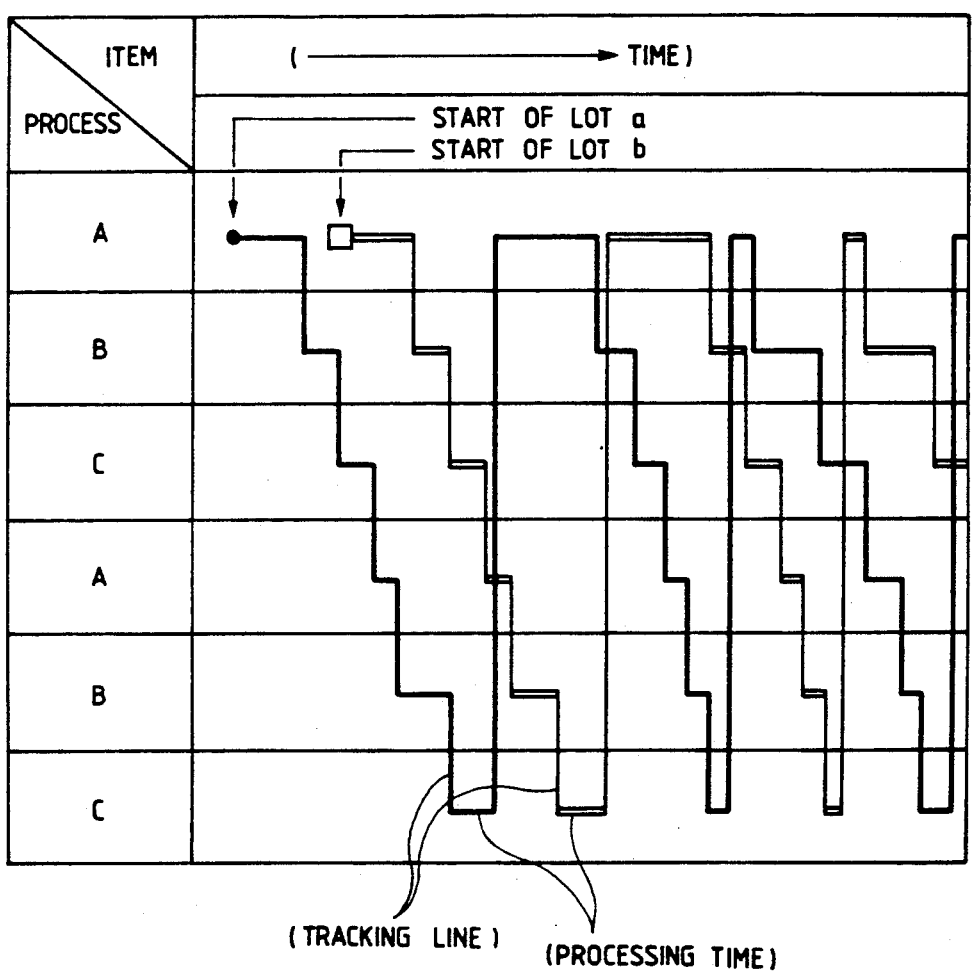

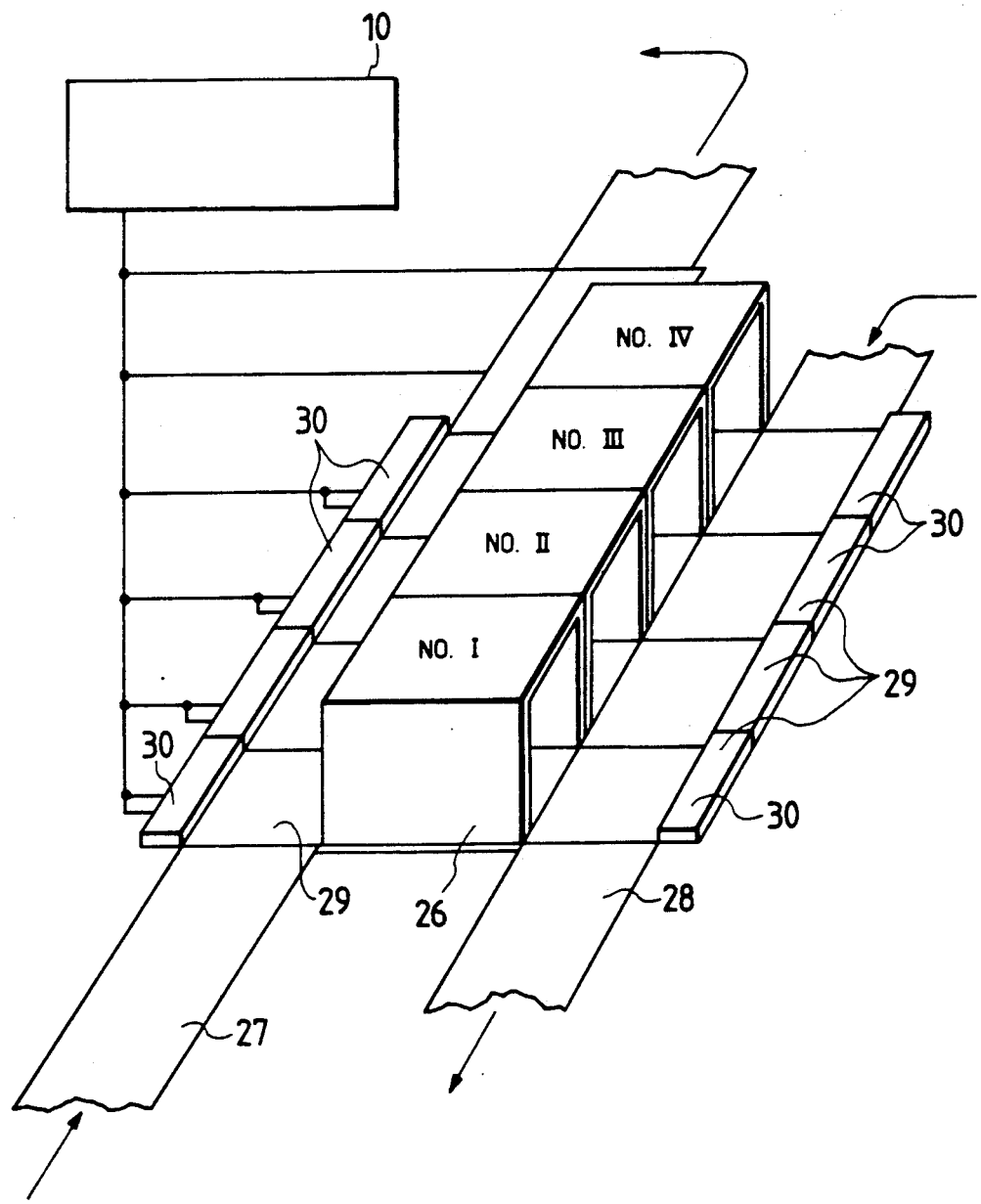

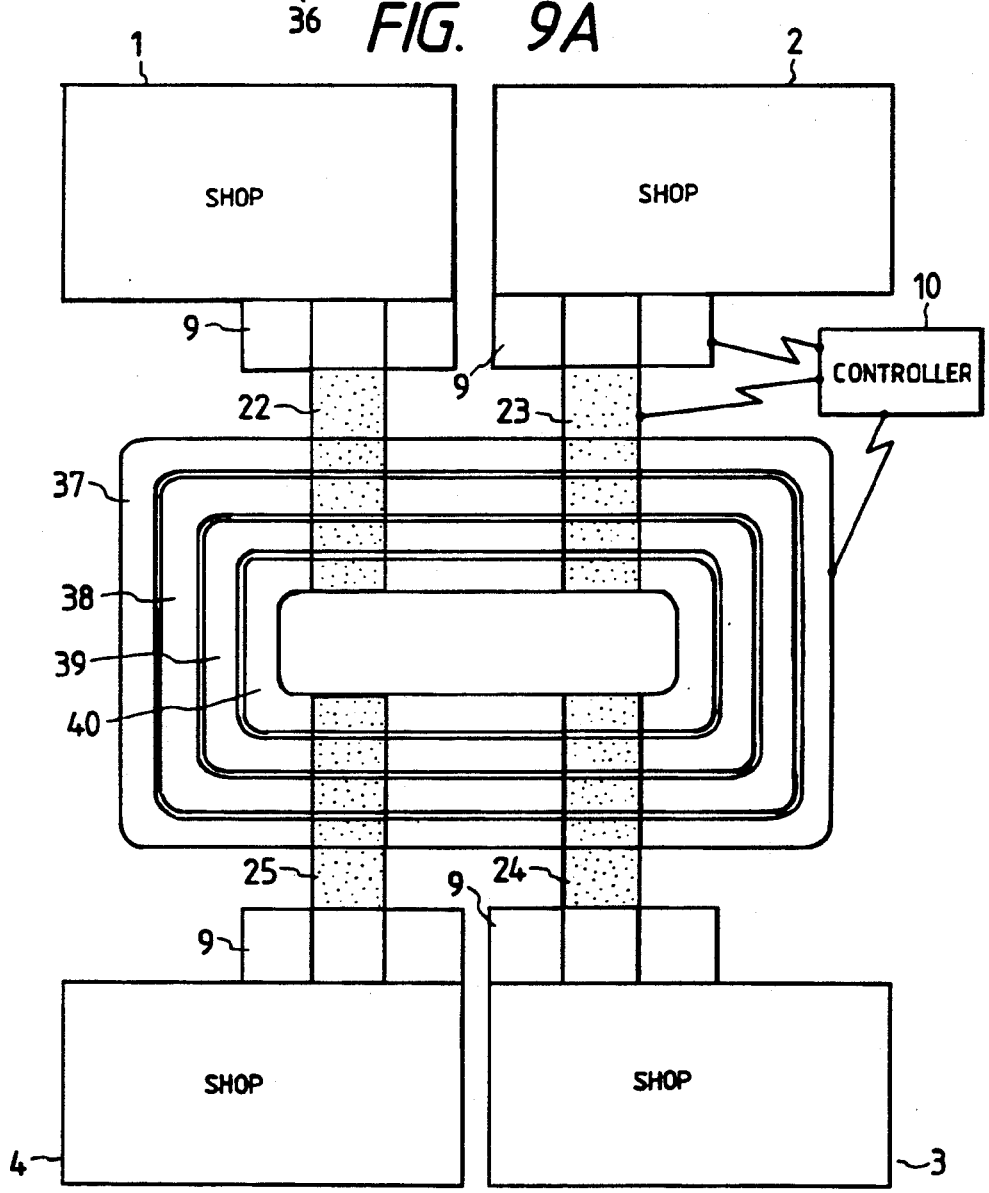

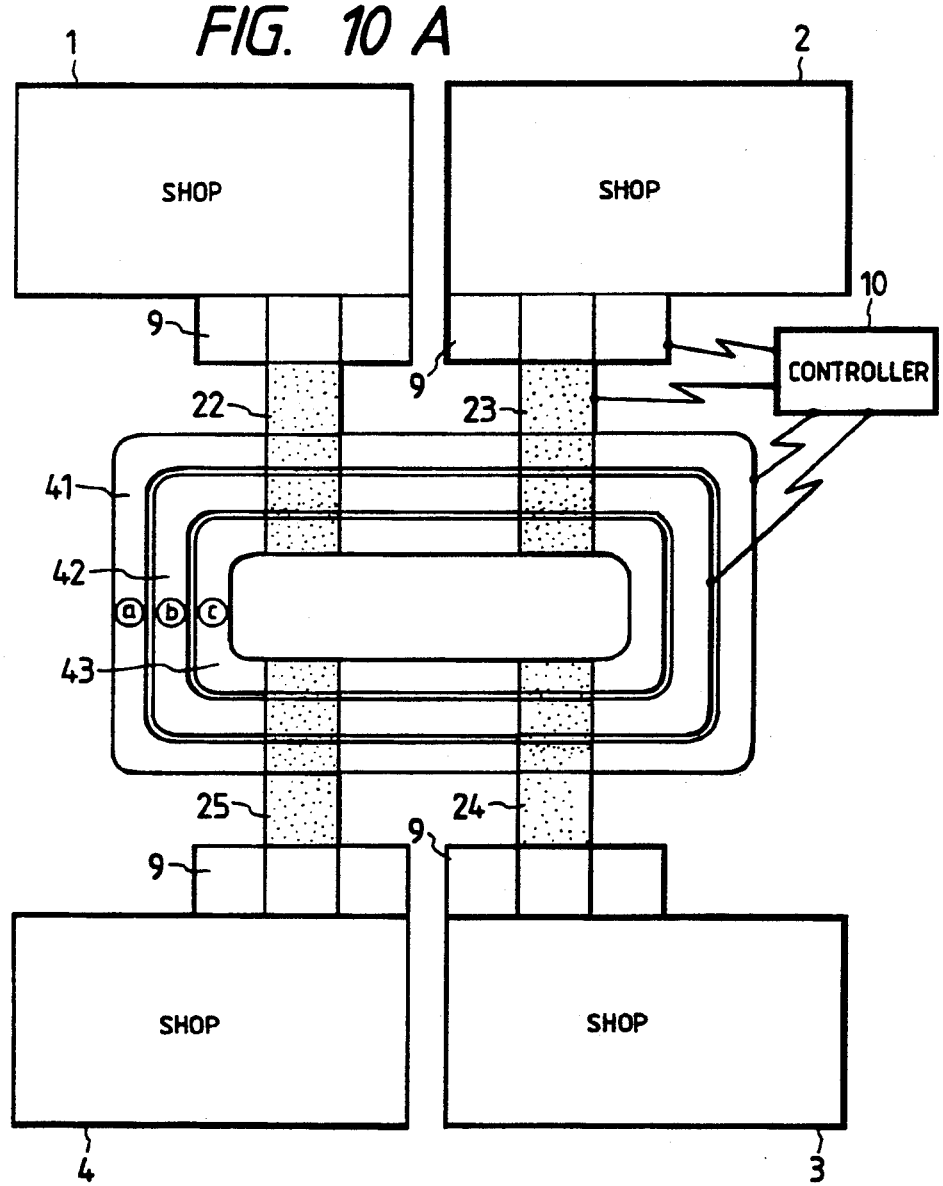

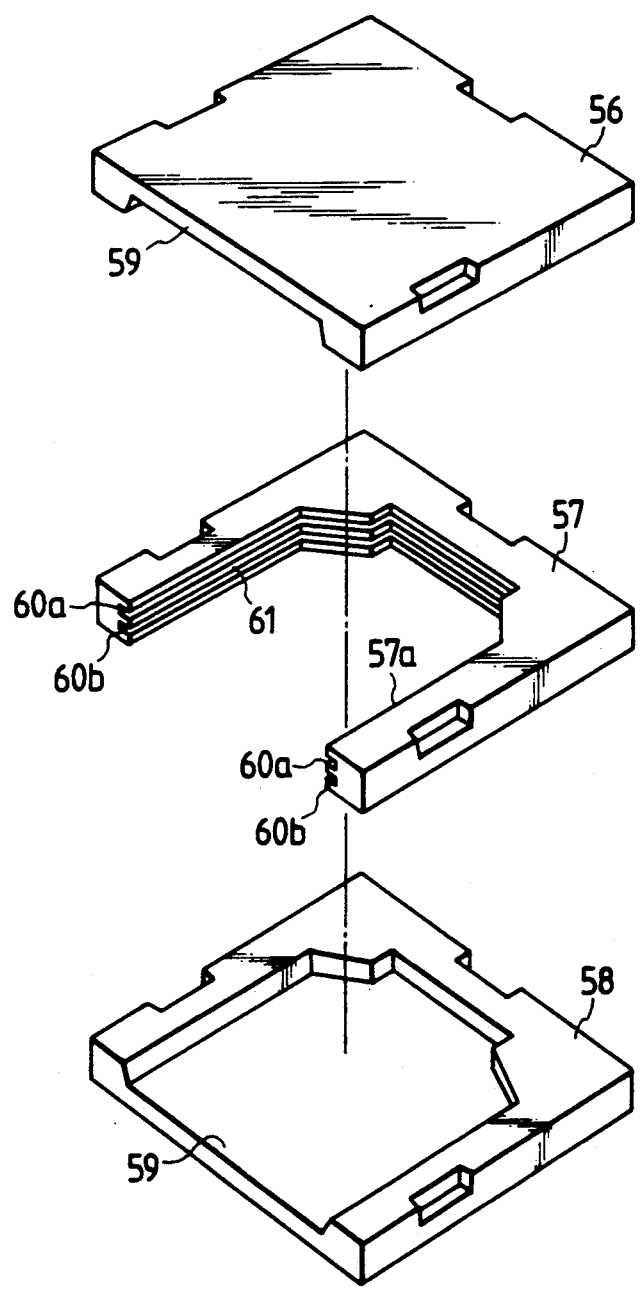

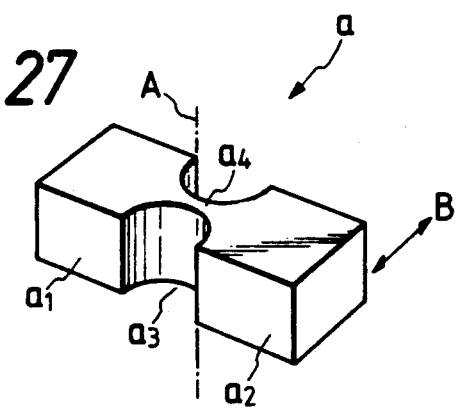
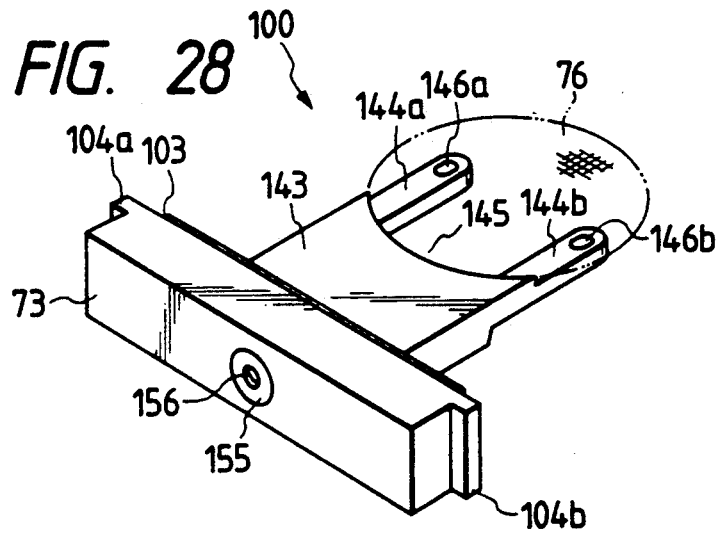
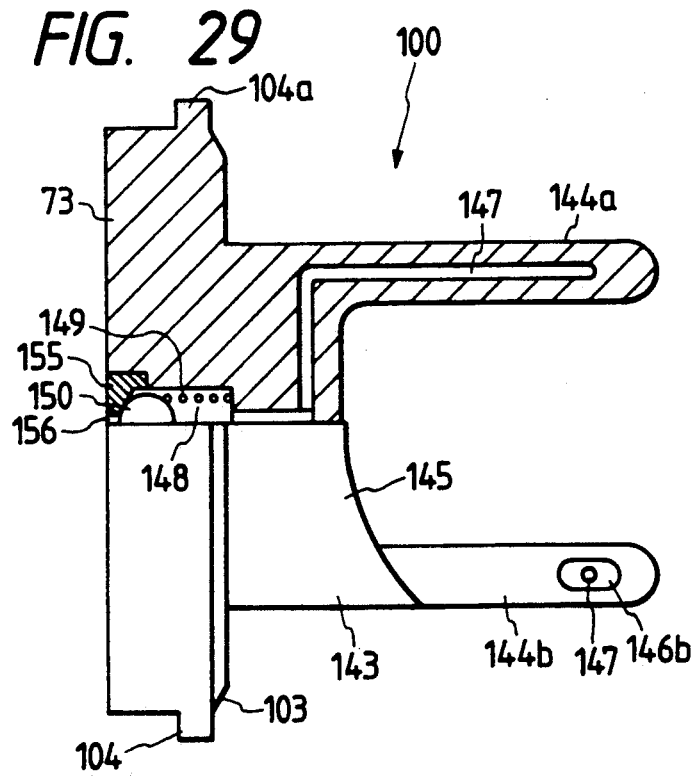

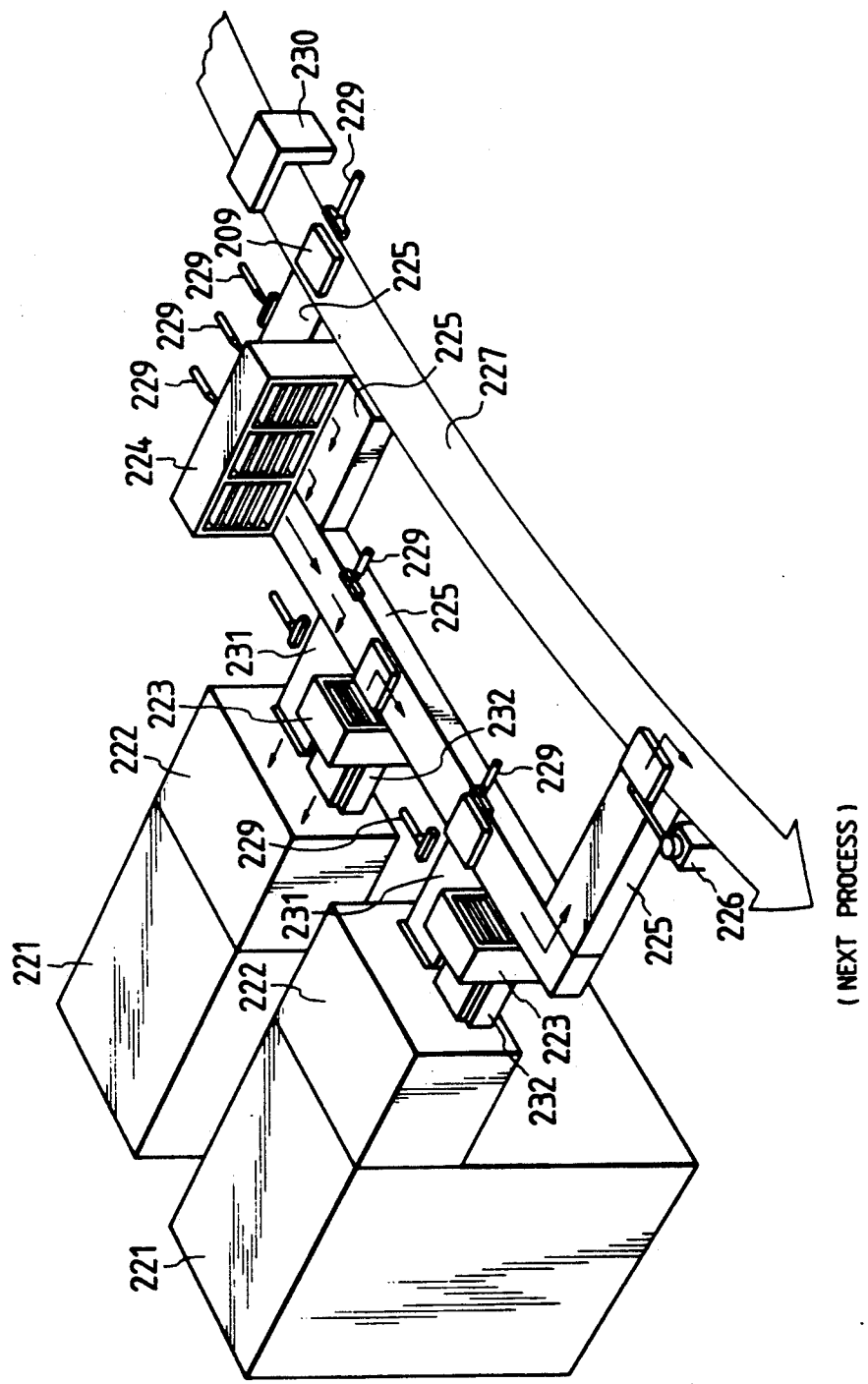

PRODUCTION SYSTEM USING WAFER-LIKE CARRIER JIG

BACKGROUND OF THE INVENTION

1. Field of the Invention

The present invention relates to a production system for semiconductors or the like, and more particularly, to a manufacture apparatus suitable for implementing the semiconductor production line as a flexible mass production line.

2. Description of the Prior Art

As described in Japanese Patent Laid-Open No. 59-213142 (1984), a conventional wafer carrier has the structure comprising a carrier with grooves for storing about 30 wafers, a container case for loading therein the carrier, and a top lid of the case.

Therefore, whenever wafers are processed by an apparatus with the capability of processing less than 30 wafers at a time, the wafers are divided into groups each including the required number of wafers, and stored in a plurality of carriers each capable of storing about 30 wafers by opening/closing the top lids of the respective carriers and using a jig such as a vacuum suction pincette, for subsequent transportation and stock. Thus, the number of carriers is increased relatively in comparison with the number of wafers residing in the manufacture process, so there has been a fear of reducing respective efficiency of transportation, stock and storage of wafers.

Further, the diameter of wafers used has been increased step by step and those wafers having the diameter in range of 120 mm to 200 mm are becoming most widely used in the art. From the viewpoints of the standard of semiconductor manufacture apparatus and the storage efficiency of wafers, however, the pitch of a groove for storage of wafers is restricted to a very narrow limit of about 6 mm withstanding such an increase in the diameter of wafers. For the reason, when larger-diameter wafers of 200 mm are manually transferred into a carrier with the conventional structure using a pincette, not only the wafers are more likely susceptible to defects, for example, cracks, chipping and so on, but also transfer operation of the wafers onto a jig specific for the apparatus extremely lowers the operation efficiency.

Since the semiconductor manufacture process for the next generation requires the processing accuracy in order of submicrons, more positive protection than now will be required against contamination due to dust in the atmosphere during transportation and stock of wafers. However, carriers with the conventional structure have accompanied a problem that wafers have to be stored, stocked or taken out while keeping their opening portions for storage facing upward, and hence very likely susceptible to contamination due to dust int he environment.

On the other hand, conventional container cases (with capacity of loading about 30 wafers per case) have tendency to prolong the period of production time, because their loading capacity unit does not match with the capacity of production line for processing wafers, and hence a waiting time occurs for each container case.

Meanwhile, to date, there has been practiced a wafer processing apparatus that a plurality of processing equipments necessary for the wafer process are arranged in the radial form around a ring-like wafer transporter line as the center, and wafers can be transferred in and out between the ring-like wafer transporter line and the respective processing equipments, as disclosed in Japanese Utility Model Laid-Open No. 60-176547, for example. However, this prior art has not taken into account the function of improving the productivity, and the function of controlling a flow of workpieces, when the wafers are sent to the processing equipments radially arranged.

Further, there is known a wafer transportation system that a transporter line is disposed in the upper space to reduce the amount of dust adhering onto a carrier box during transportation, as disclosed in Japanese Patent Laid-Open No. 60-229347, for example. There is also known a wafer transportation control method that the number of wafers to be transported to a wafer processing station is determined in consideration of the mean processing time, as disclosed in Japanese Patent Laid-Open No. 60-229348, for example. However, those techniques described in Japanese Patent Laid-Open Nos. 60-229347 and 60-229348 have not taken into account the function of implementing a mass production line under due consideration of an entire flow of workpieces.

Thus, the foregoing conventional wafer carrier jigs have not taken into account adaptation to an increase in the wafer size and large variations in the number of wafers to be processed for each of processing equipments in the semiconductor manufacture process for the next generation, adaptation to avoidance of damage on wafers at the time of wafer transfer and improvement of workability, as well as adaptation to transportation and stock while maintaining the wafer surfaces highly clean, with resulting problems of reduction in workability of storing and taking out wafers, efficiency of loading wafers into steps, and yield due to dust contamination.

In addition, the above-mentioned prior arts had no function of controlling a flow of respective lots of workpieces (wafers) and, particularly, were difficult to repeatedly apply the predetermined processing for each lot of various product groups. Also, when processing and producing lots of many different product groups, a flow of lots of wafers could not smoothly be controlled corresponding to various product groups.

SUMMARY OF THE INVENTION

It is an object of the present invention to provide a production method with which processing, transportation, stock and storage of wafers in and among equipments with capability of processing of different numbers of wafers are easily automated, workability is improved at the time of transfer of wafers, and the period of production time is shortened, while protecting the wafers from contamination during transportation and stock.

Another object of the present invention is to provide a wafer carrier jig which can also be used as a cleaning jib effectively.

Still another object of the present invention is to provide a semiconductor manufacture apparatus which can manufacture semiconductors by repeatedly applying the predetermined processing for each lot of respective product groups, and which can implement the production line as a flexible mass production line by controlling respective lots even in case of processing lots of many various products.

The above objects also contribute to achieve a production method under management of single wafer by making use of, in connection with the structure of wafer carrier jigs, a holder for holding and storing therein a single wafer and a box capable of loading therein the holder, and providing a mechanism capable of automatic transfer of the wafer in each equipment.

Further, there is provided a production system including carriers each of which has an opening portion and is formed in the peripheral walls of the opening portion with wafer storage grooves for storing a few, e.g., one of three, wafers with gaps left therebetween, and bases each having a recessed portion, the carriers and the bases being constructed to be capable of superimposing one above another.

Moreover, there is provided a production system including a plurality of carriers, and a container box for loading therein a carrier assembly consisted of the plural carriers superimposed and interconnected together, each of the carriers being constructed such that the carrier is formed in its inner side walls with wafer storage grooves for storing a few, e.g., one to three, wafers with gaps left therebetween, that the carrier is formed to have such an outer configuration as allowing the carrier to be hooked between the inner walls of the cleaning tank, that the carrier is provided with the connectors for interconnecting the plural carriers superimposed one above another, and that the interior of the carrier is formed to restrict the occurrence of turbulence of a cleaning solution at the wafer surfaces during the step of cleaning.

In addition, there is provided a manufacture production system comprising; an equipment for processing a lot consisted of plural wafers; a lot cleaning equipment; a lot inspection equipment; a plurality of shops having an intra-shop conveyor for transporting the lot among those equipments and disposed around a main lot transporter line; multistations each having a plurality of stations adapted to temporarily stock the lot therein and disposed corresponding to the shops one-to-one relation; lot transporter equipments for transporting the lot among the main lot transporter line, the multistations and the shops; a plurality of branch or junction equipments provided in each of the multistations for transferring the lot between the lot transporter equipments; a plurality of recognition devices disposed corresponding to the respective stations of each multistation for recognizing the type and the processed state of the lot; and a controller for processing the recognized results of the recognition devices, and adjusting the amount of lots delivered from the multistation of the preceding processing shop so that the quantities of inventory of lots in every two shops adjacent to each other in the process line have respective proper values.

BRIEF DESCRIPTION OF THE DRAWINGS

FIG. 2 is a view showing the process flow of lots;

FIG. 4 is an enlarged perspective view showing the relationship between a multistation of each shop and components located around same;

FIG. 9(A) is a conceptual view showing a third embodiment of the production system for which the present invention is used;

FIG. 9(B) is a view showing lots to be handled;

FIG. 10(A) is a conceptual view showing a fourth embodiment of the production system for which the present invention is used;

FIG. 10(B) is a view showing lots to be handled;

FIG. 13 is a perspective view showing one embodiment of a carrier jig according to the present invention;

FIG. 27 is a perspective view a rectangular parallelepiped hinge used in FIG. 26;

FIG. 28 is a perspective view of still another embodiment of the carrier according to the present invention;

FIG. 29 is a view showing the carrier of FIG. 28 in top plan and cross section simultaneously in its lower and upper halves, respectively;

FIG. 34 is an overview of the production system constructed using the carriers.

DESCRIPTION OF THE PREFERRED EMBODIMENTS

Preferred embodiments of the present invention will be described below with reference to the drawings.

Figure 1:
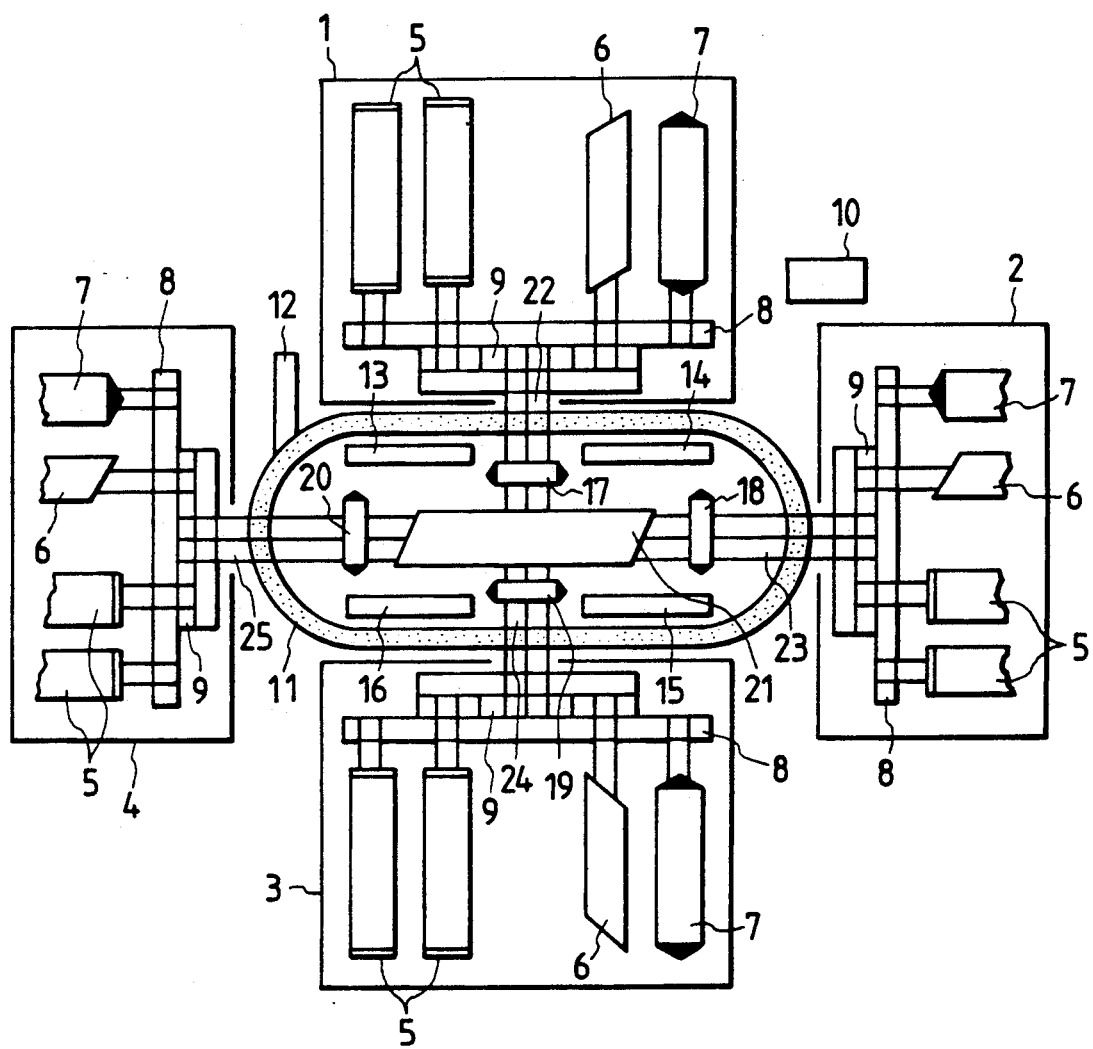
FIG. 1 is a conceptual view showing a first embodiment of a production system for which the present invention is used.

FIG. 1 is a conceptual view showing a first embodiment of a production system for which the present invention is used.

A semiconductor manufacture apparatus of the first embodiment shown in FIG. 1 comprises a plurality of four shops 1-4, a controller 10 for these shops 1-4, a ring-like main (lot transporter) line 11, machine condition monitoring systems 13-16 in the respective shops 1-4, sampling inspection equipments for evaluation 17-20 in the respective shops 1-4, a reclamation equipment for lot 21, and lot transportation equipments 22-25.

The objects to be handled in this embodiment are lots of wafers stored within lot cases each containing the predetermined number of wafers in a range of 25 to 50, or carrier jigs shown in FIGS. 13 and 22 described later on.

The shops 1-4 are installed outside the ring-like main line 11. Each of the shops 1-4 comprises a plurality of processing equipments 5, a cleaning equipment 6, an inspection equipment 7, and an intra-shop conveyer 8.

The intra-shop conveyer 8 within each of the shops 1-4 transports lots of wafers (carriers) in the sequence of processing equipments 5→cleaning equipment 6→inspection equipment 7.

In the respective shops 1-4, wafers are automatically taken out from the lot cases or carrier jigs one by one for processing. For example, each wafer is subjected to photoresistive processing in the processing equipments 5 of the shop 1, oxidation, diffusion and implantation processing in the processing equipments 5 of the shop 2, vaporization and CVD processing in the processing equipments 5 of the shop 3, and etching processing in the processing equipments 5 of the shop 4.

The cleaning equipments 6 in the respective shops 1-4 serve to clean the wafers having been processed by the processing equipments 5 in the shops 1-4.

Figure 5:
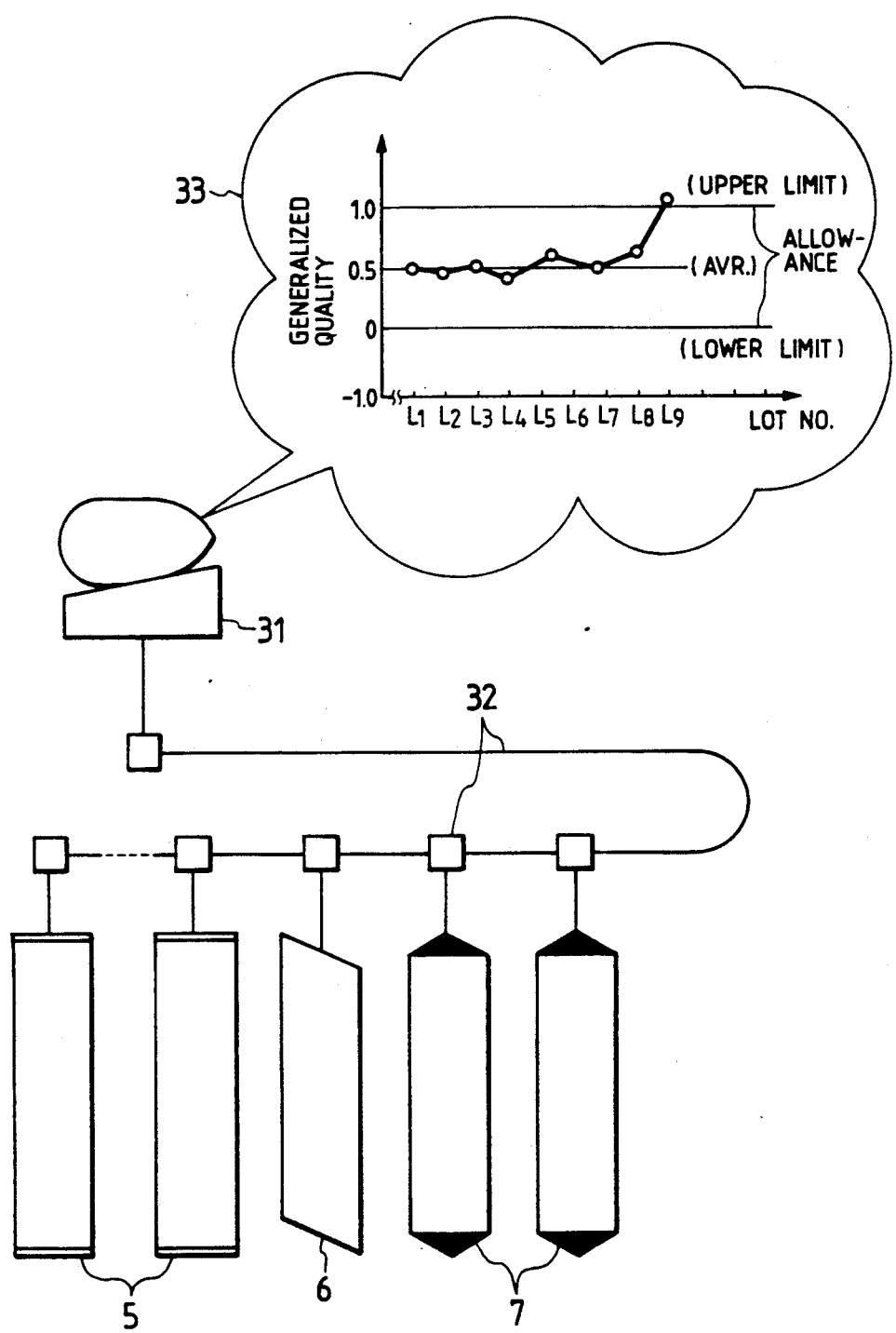
FIG. 5 is a conceptual view of an equipment condition monitoring system for each shop.

The inspection equipments 7 in the respective shops 1-4 serve to inspect the wafers having been processed by the processing equipments 5 and cleaned by the cleaning equipments 6, and then output the inspection results to a machine condition monitoring computer (see FIG. 5).

Multistations 9 in the respective shops 1-4 serve to temporarily hold lots of wafers, and have also the function of branching or joining the lots and the function of recognizing types of the lots and the processing conditions.

The controller 10 manages the multistations 9 in the respective shops 1-4 to properly adjust the quantity of lots delivered from the multistation 9 in the preceding processing shop based on the quantity of inventory of lots in the succeeding processing shop.

The main line 11 includes a lot supply and product exit station 12.

The machine condition monitoring systems 13-16 are provided corresponding to the respective shops 1-4 and disposed inside the ring-like main line 11. These machines condition monitoring systems 13-16 monitor and determine the condition of the equipments under processing in the shops 1-4. If the processing results of lots and the conditions of the equipments in the shops 1-4 are found abnormal as a result of the determination, the measures are effected to return the conditions of the abnormal equipments to be normal, and the relevant lots are sent to the sampling inspection equipments for evaluation 17-20 to evaluate the processed conditions thereof. Further, the machine condition monitoring systems 13-16 receive the evaluation results from the sampling inspection equipments for evaluation 17-20, respectively, to determine whether or not the lots are reclaimed. As a result of the determination, if the lots are to be reclaimed, they are sent to the reclamation equipment for lot 21, and if not, they are discarded.

The sampling inspection equipments for evaluation 17-20 are provided corresponding to the respective shops 1-4 are disposed inside the ring-like main line 11. The sampling inspection equipments for evaluation 17-20 sample and evaluate the lots processes by the shops 1-4, and also impact the lots sent from the machine condition monitoring system 13-16, respectively, followed by outputting the inspection results to the machine condition monitoring system 13-16. Further, the sampling inspection equipments for evaluation 17-20 receive the lots reclaimed by the reclamation equipment for lot 21, and inspect whether or not those lots are usable. As a result of the inspection, the usable lots are sent to the succeeding processing ship, while the unusable lots are discarded similarly to those which were determined unacceptable before reclamation.

The reclamation equipment 21 for lot applies the proper processing to those lots that were determined capable of reclamation, for reclaiming them into the normal lots which are then sent back to the sampling inspection equipments for evaluation 17-20.

The lot transporter equipments 22-25 connect the multistations 9 of the shops 1-4 disposed outside the ring-like main line 11 and the various equipments disposed inside the ring-like main line 11.

FIG. 2 shows the process flow of lots.

Referring to FIG. 2, processes A, B and C represent the processes carried out by the processing equipments 5, the cleaning equipment 6, and the inspection equipment 7 in each of the shops 1-4 shown in FIG. 1, for example. These equipments in FIG. 1 sequentially process the lots in order of lot a, lot b and so on as shown in FIG. 2.

Figure 3A:
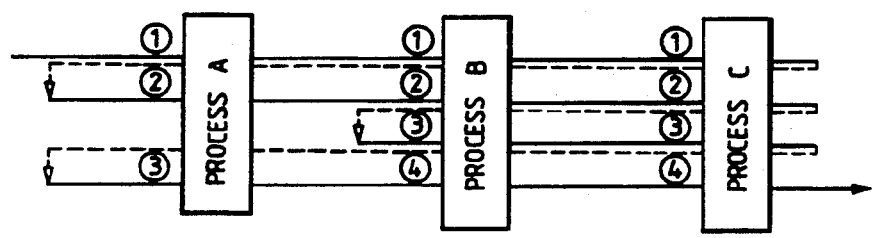
FIGS. 3(A) and 3(B) are views respectively showing the prior art and the embodiment of FIG. 1 for comparison of a flow of lots therein.
Figure 3B:
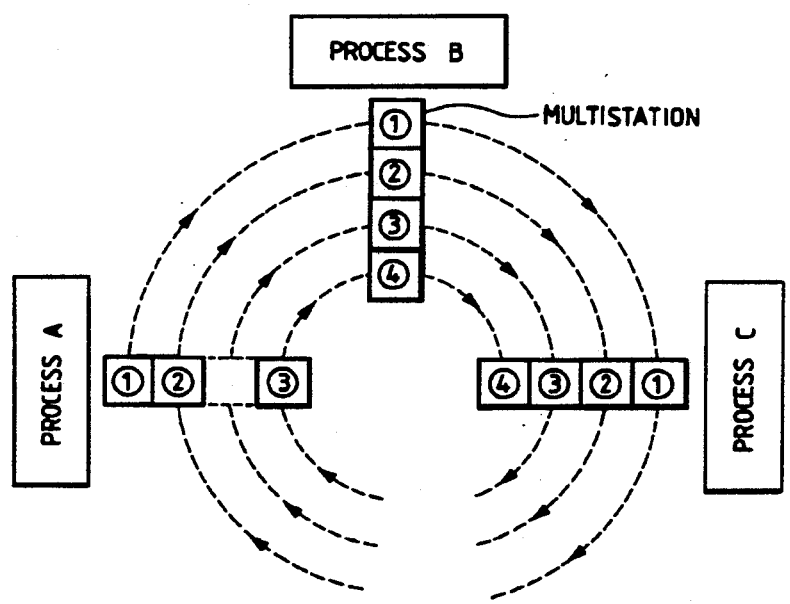

FIGS. 3(A) and 3(B) are views showing the prior art and a first embodiment of the present production system, respectively, for comparison of a flow of lots therein.

FIGS. 3(A) and 3(B) illustrate the case where the process flow for product groups shown in FIG. 2 proceeds by repeating the processes A, B and C.

The above processes A, B and C are repeated four times; the first processing is represented by ①, the second processing by ②, the third processing by ③, and the fourth processing by ④, respectively.

In the prior art shown in FIG. 3(A), the lots are managed in units of processes, so the process flow is disordered dependent on situations. More specifically, since a plurality of lots relating to the processings ①, ② and ③ are concurrently handled in the process A, for example, the priority sequence can be determined optionally. As a result, it has been customary to select the process flow with weight given to the operation efficiency of the process A.

According to the present invention, as shown in FIG. 3(B), the lots are managed through the respective multistations by repeating the processes A, B and C for each of the first to fourth processings, thereby creating a flow of lots. Further, each lot is advanced taking into account the quantity of inventory in the succeeding process, so that a production line is formed. For example, the lot in ② of the process B is advanced after the lot in ② of the process C has been processes and advanced therefrom. In this way, the process flow can be rearranged into a line with functional arrangement of the conventional processes remained unchanged.

FIG. 4 is an enlarged perspective view showing the relationship between the multistation installed in each shop and components located around same.

The multistation 9 shown in FIG. 4 has a plurality of stations 26. The multistation 9 also includes first and second transporter equipments 27, 28, branch or junction equipments 29, and sensors 30.

The stations 26 are arranged between the first and second transporter equipments 27, 28 corresponding to the maximum value of number of repeated processes for each product group, i.e., the number of lots a, b, . . . shown in FIG. 2. It is prescribed that the particular lot a should be placed in the No. I station 26, the particular lot b should be placed in the No. II station 26, and so on, as shown in FIG. 4 by way of example. Even though the No. I station 26 is now vacant after the lot a has been sent therefrom to some shop through a subline, for example, any other lots should not be place in that No. I station 26.

The first transporter equipment 27 is constituted such that it receives lots from relevant one of the lot transporter equipments 22-25 respectively connecting among the shops 1-4, the main line 11 and the various equipments disposed inside the main line, and then carries the received lots up to a position where the branch or junction equipments 29 are located, while it receives lots from the branch or junction equipments 29 and pass them to the relevant one of the lot transporter equipments 22-25.

The second transporter equipment 28 serves to receive lots from the branch or junction equipments 29 and send them to the relevant one of the shops 1-4 through the subline. The second transporter equipment 28 also serves to receive the lots processes by the relevant one of the shops 1-4 and pass them to the branch or junction equipments 29 corresponding to the predetermined stations 26.

The branch or junction equipments 29 are disposed corresponding to the respective stations 26 one-to-one relation. Each of the branch or junction equipments 29 is so constituted as to receive a lot from the first transporter equipment 27 and place it in the relevant station 26 in response to a command from the controller 10, and also withdraw the lot from the relevant station 26 and pass it to the second transporter equipment 28 in response to a command from the controller 10. Further, the branch or junction equipments 29 receive the lots processed by the relevant one of the shops 1-4 from the second transporter equipment 28 and once place them in the predetermined stations 26 in response to a command from the controller 10.

The sensors 30 are disposed corresponding to the stations 26 one-to-one relation. Each of the sensors 30 serves to read the item indicated on the relevant lot, recognize the type and processed condition of the lot, and output the recognition result to the controller 10.

In short, the multistations 9 of the respective shops 1-4 are each constituted as follows. First, the multistation 9 place the lot processed by the relevant one of the shops 1-4 in the station 26 for temporary stock. When the quantity of inventory of the lot in the succeeding processing shop, i.e., the quantity of inventory of the lot in the shop 2 for the shop 1, the quantity of inventory of the lot in the shop 3 for the shop 2, and so on, reaches a proper value, the multistation 9 withdraws the lot from the station 26 through the branch or junction equipment 29 and passes it to the first transporter equipment 27 in response to a command from the controller 10. Subsequently, the lot is sent in order of the relevant lot transporter equipment→main line 11→lot transporter equipment in the succeeding process→multistation 9 in the succeeding processing shop.

The following features are derived with the manufacture apparatus thus constructed.

Firstly, by incorporating the means for automatically recognizing lots, the transporter equipments can be implemented in the form of a simple single conveyer or the like. Secondly, by additionally providing other branch or junction equipments (not shown) adapted to divert the flow of line normal to that including the multistation 9, for example, it becomes possible to overtake another lot or bypass the shop. This permits to adapt many types of lot groups.

FIG. 5 is a conceptual view of an equipment condition monitoring system for each shop.

The equipment condition monitoring system shown in FIG. 5 comprises an equipment condition monitoring computer 31, and a local area network 32 connecting the processing equipments 5, the cleaning equipment 6, and the inspection equipments 7 of each shop.

The equipment condition monitoring system collects online result values such as processing times in the processing equipments 5 of each shop, result values such as the extent and concentration of contamination in the cleaning equipment 6, and other result values precisely indicating the conditions of lots and equipments, such as a film thickness and contents of the components inspected by the inspection equipments 7. The equipment conditions are automatically managed using a management chart 33 based on the result values indicating characteristics of the processed lots and the respective equipments, thereby to grasp the occurrence of any abnormality or tendency of the equipment conditions in real time. If any changes in the equipment conditions are found, an instruction is issued to take a measure for restoring the relevant equipment to the normal condition, and relevant one of the machine conditioning monitoring system 13-16 shown in FIG. 1 are prompted to conduct detailed inspection for the lots processed by the shop having the relevant equipment.

Figures 6A, 6B:
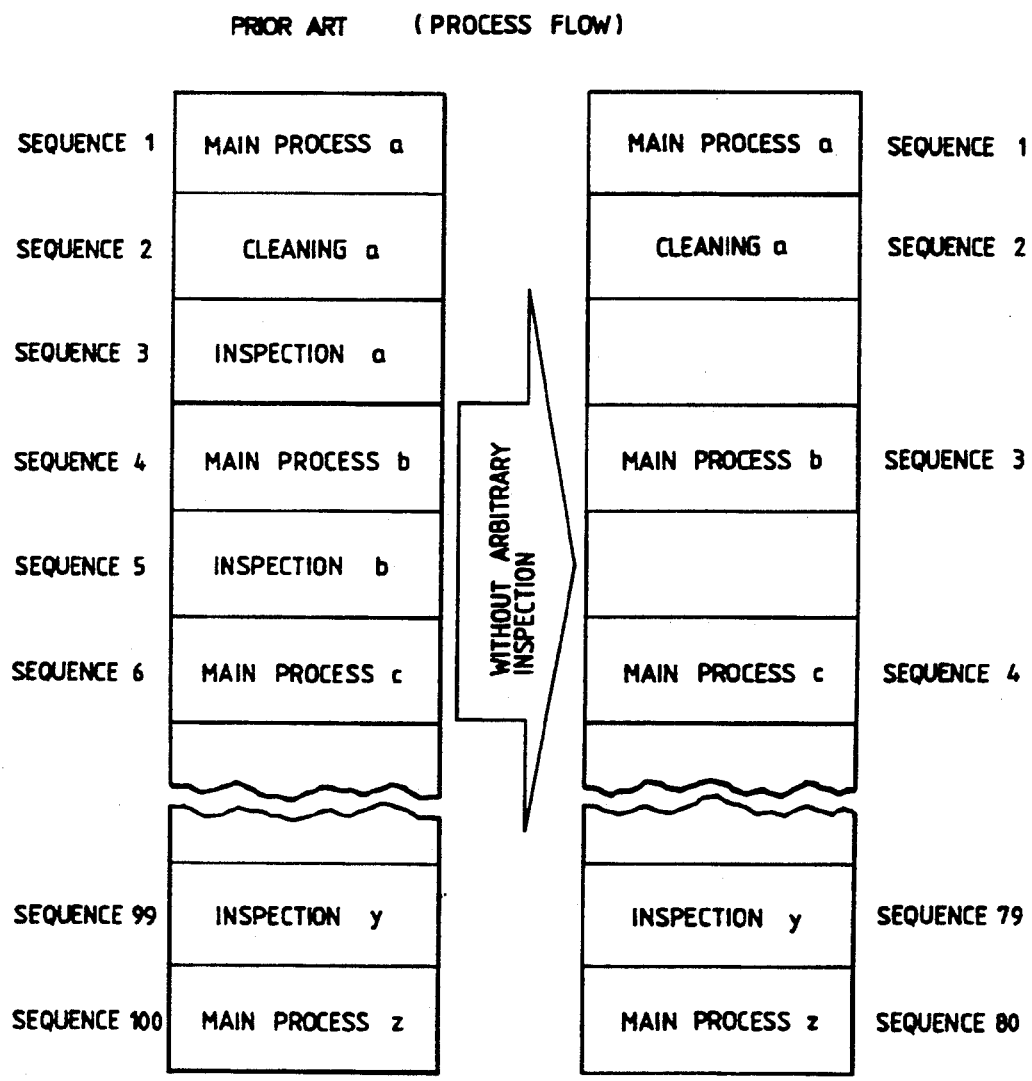
FIGS. 6(A) and 6(B) are views respectively showing the prior art and the embodiment of FIG. 1 for comparison of their process flows.

FIG. 6(A) shows a process flow in the prior art, and FIG. 6(B) shows a process flow according to this embodiment of the present invention.

In this embodiment of the present invention, as a result of incorporating the equipment condition monitoring system shown in FIG. 5, it becomes possible to omit those inspection processes in the conventional process flow as shown in FIG. 6(A) which have been carried out at all times. This permits to shorten the processing time of lots, discover any abnormality of the processed lots per shop, and take an adequate countermeasure for the equipments of the shop where any abnormality was discovered.

However, the foregoing inspection processes will not be omitted when the equipments in a certain shop is hard to maintain a steady condition in its nature, when an unstable condition is expected at the rising time in operation of the equipments and processing of lots, or when an abnormal condition is likely to occur frequently.

When the equipments of each shop has shifted from a rising condition to a steady condition, or it is determined that the equipments have returned from an abnormal condition to a steady condition, the machine condition monitoring system shown in FIG. 5 is now automatically operated to conduct the concentrated management. As a result, it is no longer necessary to post some operators mainly for monitoring of the shops. At the same time, operation site is separated into an unattended processing and work area and an attended management and security area. This permits to construct an automatic line intended for the dust-free area due to the unattended shops, and also facilitate management of the shops.

Further, when the equipment condition monitoring system determines that processing of lots is adversely affected by changes in the equipment condition, the lots processed by the shops 1-4 are checked so as to their reclamation measures by utilizing the machine condition monitoring systems 13-16 and the sampling inspection equipments for evaluation 17-20 shown in FIG. 1.

Figure 7A:
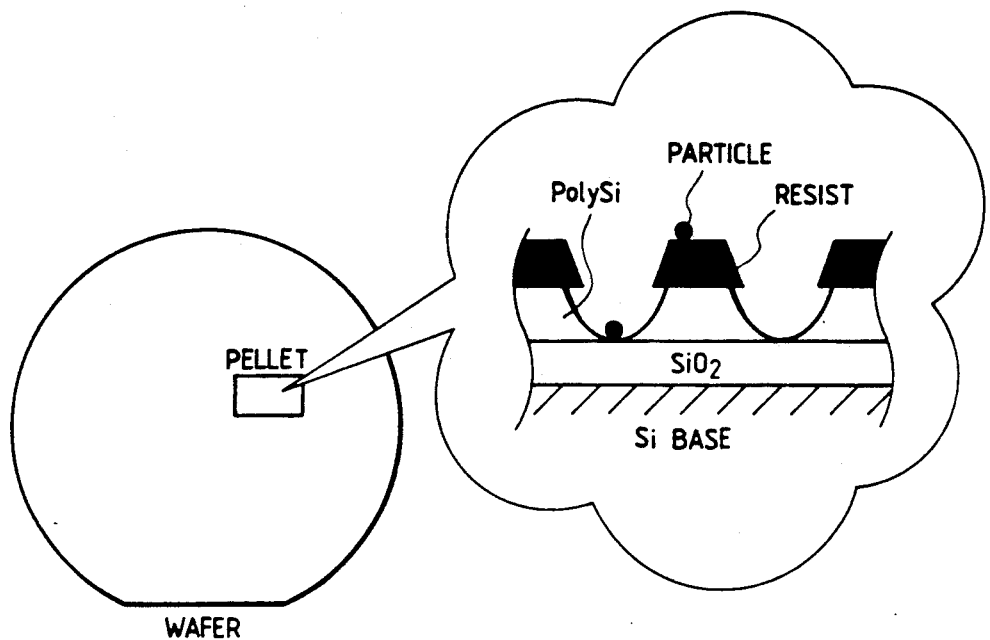
FIG. 7(A) is a view showing one example of abnormality occurred in a wafer included in a lot.

FIG. 7(A) shows one example of abnormality (defect) occurred in a lot due to changes in the equipment condition of any shop, in which particles have adhered on a wafer.

As shown in FIG. 7(A), if particles have adhered on a wafer, relevant one of the sampling inspection equipment for evaluation 17-20 output the result of inspecting adherence of particle onto the wafer to corresponding one of the machine condition monitoring systems 13-16, which works out a reclamation measure of "removing the particles from wafer". The wafer and the reclamation are both delivered to the reclamation equipment for lot 21 for conducting the reclamation processing.

The lot including the wafer which has been subjected to the reclamation measure in the reclamation equipment for lot 21 is, as mentioned above, returned back against to relevant one of the sampling inspection equipments for evaluation 17-20 for re-inspection. If the lot has been judged as reusable as a normal lot, it is delivered to the succeeding processing shop. If not, it is discarded.

Figure 7B:
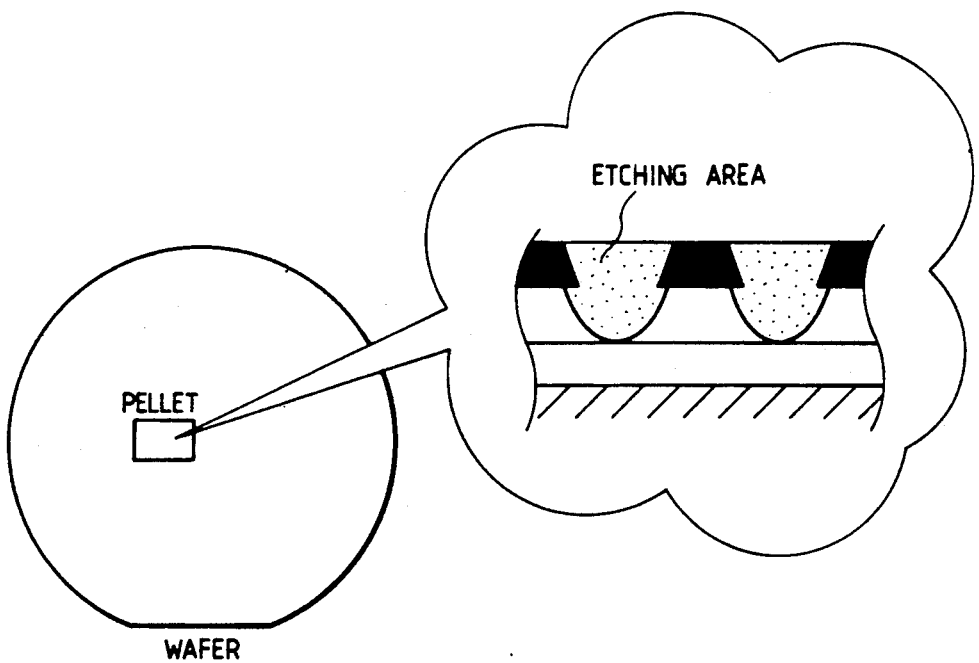
FIG. 7(B) is a view showing one example of processing to be applied to the lot midway the process flow.

FIG. 7(B) shows one example of processing to the applied to the wafer midway the process flow.

The processing additionally required to be made midway the process flow, as shown in FIG. 7(B), is carried out b not the reclamation equipment for lot 21 inside the ring-like main line 11, but the processing equipments installed in the respective shops 1-4.

By so doing, any abnormalities of lots occurred in the respective shops can evenly be serviced, thereby enabling to achieve the reclamation equipments for lot with a more variety of functions.

Consequently, since the processing time can be shortened by omission of the same inspection processes and the lots having been found abnormal can be reclaimed, as mentioned above, it also becomes possible to improve the productivity.

The foregoing semiconductor manufacture apparatus of the first embodiment is run and operated as follows.

First, a lot of wafers accommodated in the lot case is supplied from the lot supply and product exit station 12 to the ring-like main line 11.

The main line 11 receives the lot and transports it in a certain direction up to the lot transporter equipment 22 associated with the first processing shop 1. The lot transporter equipment 22 transports the lot up to an installed position of the multistation 9 in the shop 1, and passes it to the first transporter equipment 27 of the multistation 9 as shown in FIG. 4.

The first transporter equipment 27 of the multi-station 9 in the shop 1 transports the lot to a position where the branch on junction equipments 29 are arranged. When the lot reaches such a position where the branch or junction equipments 29 of the multistation 9 in the shop 1 are arranged, the sensors 30 detect the product group of the lot and then output the detected results to the controller 10.

The controller 10 receives the detected result about the product group of the lot from the relevant sensor 30 and delivers a command to the relevant branch or junction equipment 29 based on the received input, so that the lot is once placed through the branch on junction equipment 29 into the station 26 with the predetermined number corresponding to the product group detected. For example, where the lot transported to the multistation 9 is a lot a, it is placed into the No. I station 26 shown in FIG. 4. In case of lot b, it is placed into the No. II station 26.

Receiving the lot, the shop 1 searches and gets the equipment operating requirements corresponding to the job schedule of the lot as per the product group and process from the controller 10, and then delivers such equipment operating requirements to the processing equipments 5, the cleaning equipment 6 and the inspection equipments 7.

In response to a command from the controller 10, the branch or junction equipment 29 of the multistation 9 in the shop 1 withdraws the lot from the predetermined station 26 and passes it to the second transporter equipment 28. Subsequently, the second transporter equipment 28 receives the lot and passes it to the intra-shop conveyor 8 in the shop 1. The intra-shop conveyer 8 sends the lot through the processing equipments 5, the cleaning equipment 6 and the inspection equipment 7 in this order.

In the shop 1, the processing equipments 5 apply the predetermined processings to the lot, the cleaning equipment 6 cleans the processes lot, and the inspection equipment 7 inspects the condition thereof.

During the above step, the equipment condition monitoring system shown in FIG. 5 collects online into the condition monitoring computer 31 through the local area network 32 result values such as processing times in the processing equipments 5 of the shop 1, result values such as the extent and concentration of contamination in the cleaning equipment 6, and other result values precisely indicating the conditions of processed lots and equipments, such as a film thickness and contents of the components inspection by the inspection equipments 7.

Then, the equipment condition monitoring system automatically manages the equipment conditions using the management chart 33 as shown in FIG. 5, based on the result values indicating characteristics of the processed lots and the equipments in the shop 1. Thus, the equipment condition monitoring system can grasp the occurrence of any abnormality or tendency of the equipment conditions in real time.

If any changes in the equipment conditions are found, the equipment condition monitoring system issues an instruction to take a measure for restoring the relevant equipment to the normal condition, and prompts the machine condition monitoring system 13 shown in FIG. 1 to conduct detailed inspection for the lots processed by the shop 1.

The machine condition monitoring system 13 sends a command to the sampling inspection equipment for evaluation 17 to start sampling inspection of the lot processed by the shop 1.

In response to the command from the machine condition monitoring system 13, the sampling inspection equipment for evaluation 17 conducts sampling inspection of a wafer in the lot taken out from the multistation 9 of the shop 1 through the lot transporter equipment 22, and then outputs the inspected result to the machine condition monitoring system 13.

Based on the inspected result input from the sampling inspection equipment for evaluation 17, the machine condition monitoring system 13 determines whether or not the wafers in the defective lot are reclaimable, and if possible, it works out a measure for reclamation.

If the machine condition monitoring system 13 has determined that the wafers in the defective lot can be reclaimed, it sends the wafers and the measure for reclamation to the reclamation equipment for lot 21 are shown in FIG. 1. Otherwise, the wafer are discarded.

The reclamation equipment for log 21 receives the lot including the defective wafer and the measure for reclamation from the machine condition monitoring system 13, applies the reclamation processing to the wafers, and sends the wafers again to the sampling inspection equipment for evaluation 17.

The sampling inspection equipment for evaluation 17 inspects the wafers that have been subjected to the reclamation processing in the reclamation equipment for lot 21. If the wafers are judged usable as a result of the inspection, the lot including the reclaimed wafers is sent to the multistation 9 in the succeeding processing shop 2 through the route of lot transporter equipment 22→main line 11→lot transporter equipment 23. If the wafers having been subjected to the reclamation processing are judged still unusable as a result of the inspection, they are discarded.

Incidentally, if the result of monitoring the equipments in the shop 1 by the associated equipment condition monitoring system determines that those equipments are in the steady normal condition, the inspection process to be carried out in the inspection equipments 7 of the shop 1 is omitted.

The lot processed by the shop 1 is transported by the second transporter equipment 28 in the multistation 9 of the shop 1 to a position where the branch on junction equipments 29 are arranged. In response to a command from the controller 10, relevant one of the branch or junction equipments 29 is controlled to temporarily hold the lot in the predetermined station 26 corresponding to the product group.

During the above step, the controller 10 calculates the quantity of inventory of the lot in the succeeding processing shop 2. At the same time the quantity of inventory of the lot in the shop 2 reaches a proper value, the controller sends a command to a branch or junction equipment 29 in the multistation 9 of the preceding processing shop 1. In response to the command from the controller 10, the branch or junction equipment 29 in the shop 1 withdraws the lot from the relevant station 26 and places it into the predetermined station 26 in the multistation 9 of the shop 2 through the route of first transporter equipment 27 in the shop 1→lot transporter equipment 22→first transporter equipment 27 in the multistation 9 of the shop 2.

Thereafter, the lot is sequentially processed by the shops 2, 3 and 4 by repeating the same processes as those in the shop 1.

The products processed and finished by the final shop 4 are caused to exit through the lot supply and product exit station 12 associated with the main line 11, thereby completing one cycle of semiconductor manufacture.

In the above, when the processing speeds per lot of the equipments in the shops 1–4 are set equal to the transporting speed of the main line 11, the production line like an assembly line using conveyers can be implemented. Also, by controlling the number of lots to be kept in hand of the shops 1–4 at a time for processing, it is possible to reduce the manufacture time and the quantity of inventory.

Figure 8A:
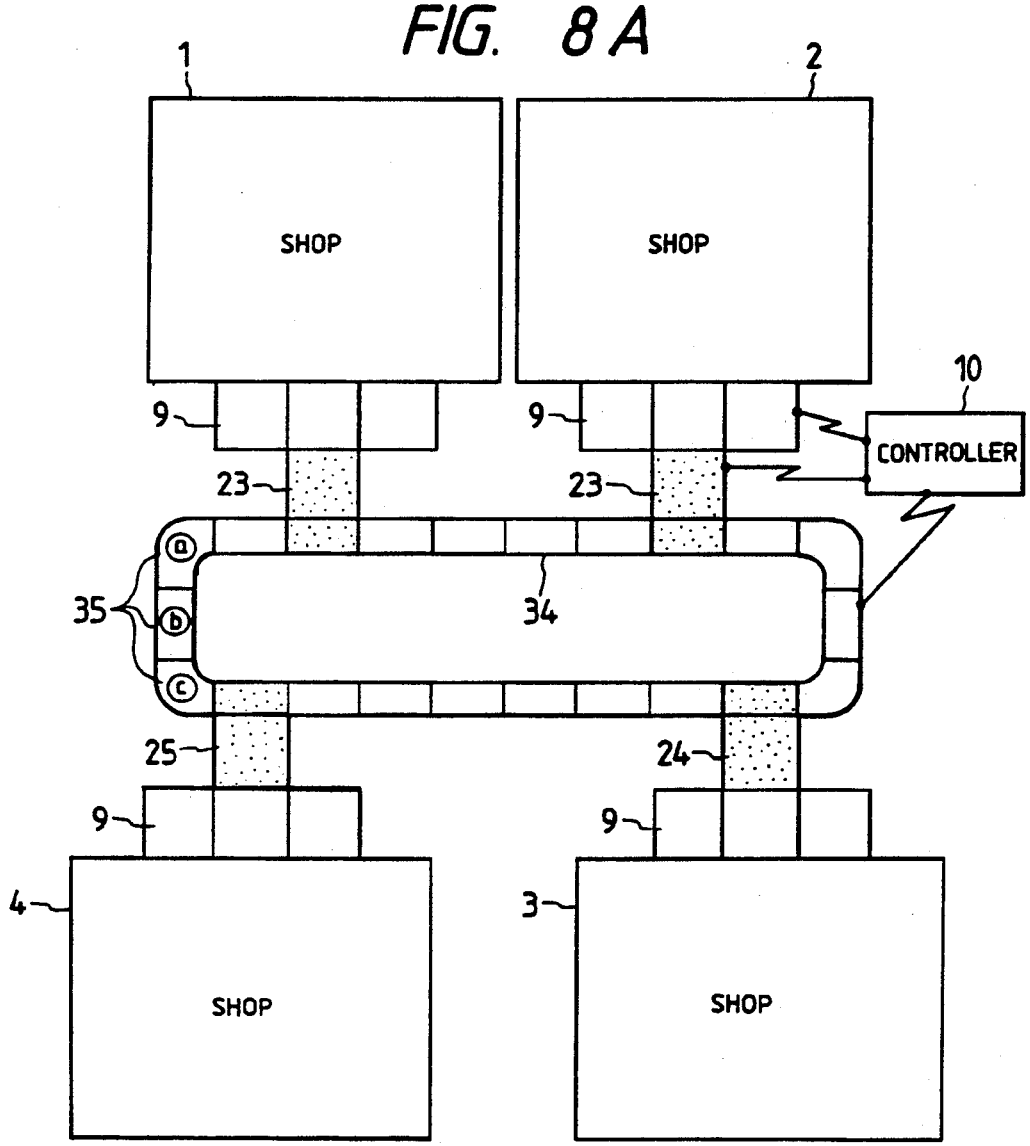
FIG. 8(A) is a conceptual view showing a second embodiment of the production system for which the present invention is used.
Figure 8B:
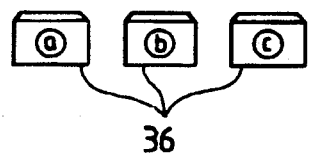
FIG. 8(B) is a view showing lots to be handled.

Next, FIG. 8(A) is a conceptual view showing a second embodiment of the semiconductor manufacture apparatus of the present invention, and FIG. 8(B) is a view showing one example of lots for respective product groups.

In the embodiment shown in FIG. 8(A), a ring-like main (lot transporter) line 34 is provided with separate designated palettes 35 for the respective lots 36 of product groups a, b and c.

In this case, assuming that the number of multi-station areas Si of a multistation j for which the lot 36 is destined is the maximum value of the number of times Nij necessary for a product group 1 to be repeatedly processed in the multistation j, the number of designated palettes Lj in the multistation j can be expressed by the following equation:

$$Lj = \frac{\Sigma Nij}{\Sigma\Sigma Nij} \times Z$$

where Z is the optimum quantity of inventory in all the shops.

The designated palettes 35 for the respective product groups are evenly provided in the main line 34 for each shop.

Thus, according to the second embodiment, the designated palettes can rationally be set in the main line.

FIG. 9(A) is a conceptual view showing a third embodiment of the semiconductor manufacture apparatus of the present invention, and FIG. 9(B) is a view showing lots to be handled.

In this embodiment shown in FIG. 9(A), four main (lot transporter) lines 37–40 for the respective shops are concentrically formed in the form of a ring corresponding to the shops 1–4.

More specifically, when the lot 36 is sent to the first processing shop 1 in this embodiment, for example, the lot 36 is laid on the main line 37. Where processing of the lot has been completed in the shop 1 and then transported from the multistation 9 of the shop 1 to another shop, the succeeding processing shop is researched based on a shop progress management table prepared in advance.

If the searched shop is given by the shop 2, for example, the lot 36 is shifted to the main line 38 and transported to the shop 2 through the main line 38.

According to the third embodiment, the main lines 37-40 for the respective shops can be utilized as lot stocking means, so the multistation 9 of each shop can be consisted of only three areas; i.e., receive area, eject area and spare area.

Further, because the transporting speeds of the main lines can be set corresponding to the equipment processing speeds per lot of the respective shops, it becomes possible to improve productivities of the shops having different processing units from each other.

FIG. 10(A) is a conceptual view showing a fourth embodiment of the semiconductor manufacture apparatus of the present invention, and FIG. 10(B) is a view showing one example of lots to be handled.

In this embodiment shown in FIG. 10(A), ring-like main lines (lot transport lines) 41, 42 and 43 are concentrically formed corresponding to the lots 36 of product groups a, b and c.

Where the product group a of the lot 36 is processed and sent to the succeeding processing ship 2 in this embodiment, for example, the product group a is discriminated in the multistation 9 of the shop 1 and shifted to the main line 41 exclusively intended for the product group.

Thus, merely by discriminating the lots 36 of product groups a, b and c and shifting the lots 36 to the respective main lines 41, 42 and 43 exclusively intended for the product groups, those products groups can be transported to the corresponding next shops.

Further, if the processing speeds per lot of the shops for the respective product groups are extremely different from each other, it is possible to define production lines for the respective product groups by classifying a set of equipments in the shop into subsets of those necessary for every product groups. In this case, the multistation 9 of each shop may be managed for each of the product groups.

Figure 11:
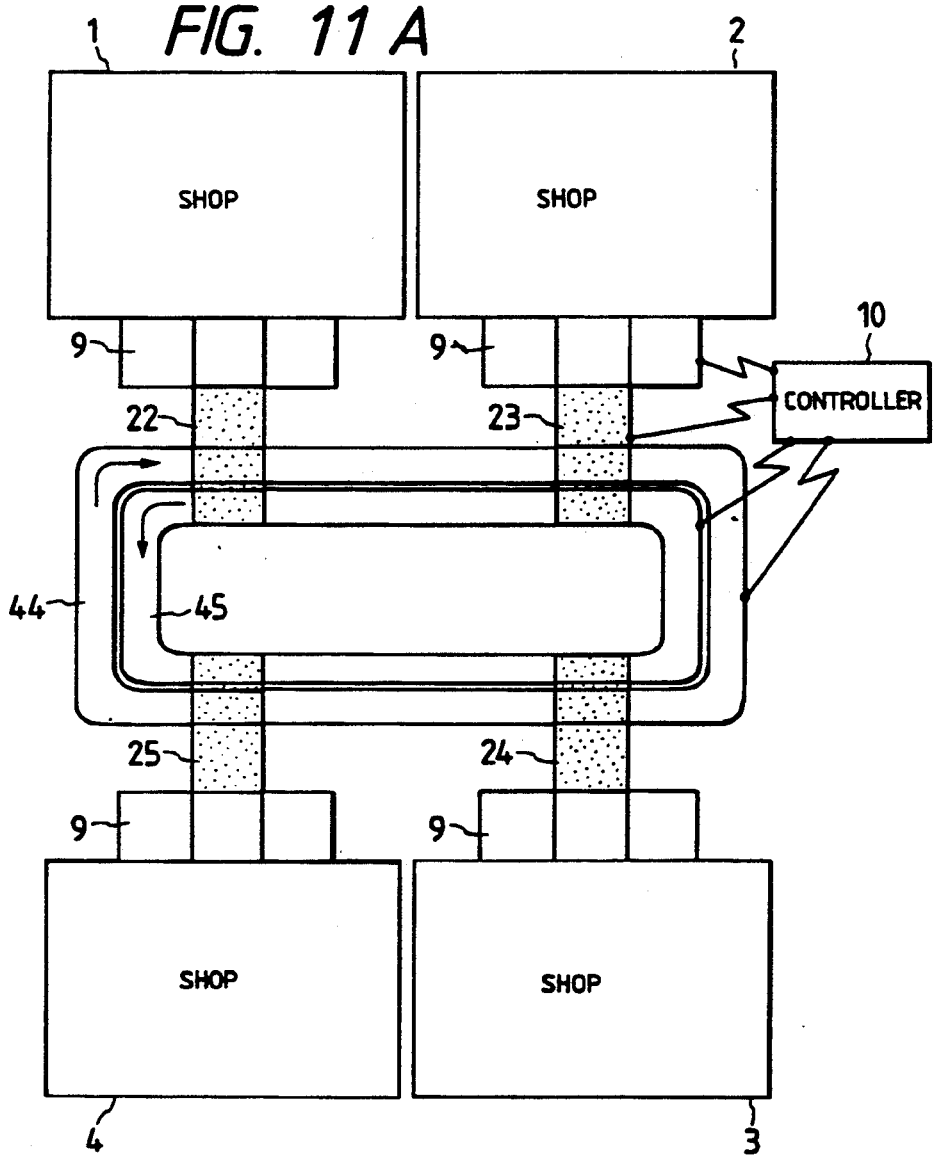
FIG. 11(A) is a conceptual view showing a fifth embodiment of the production system for which the present invention is used.
FIG. 11(B) is a view showing lots to be handled.

FIG. 11(A) is a conceptual view showing a fifth embodiment of the semiconductor manufacture apparatus of the present invention, and FIG. 11(B) is a view showing one example of lots to be handled.

In this embodiment shown in FIG. 11(A), two main (lot transporter) lines 44, 45 are arranged concentrically.

It is arranged such that one main line 44 is turned clockwise, while the other main line 45 is turned counterclockwise.

Where the lot 36 processed by the shop 1 is now transported to the shop 3 as a succeeding processing shop, for example, the controller 10 determines which one of the main lines 44 and 45 can earlier transport the lot to the shop 3, and then commands the lot 36 to be shifted onto the main lien that can bring it to the shop 3 at earliest.

This embodiment is suitable for producing many groups of products and makes it possible to improve the productivity.

Figure 12A:
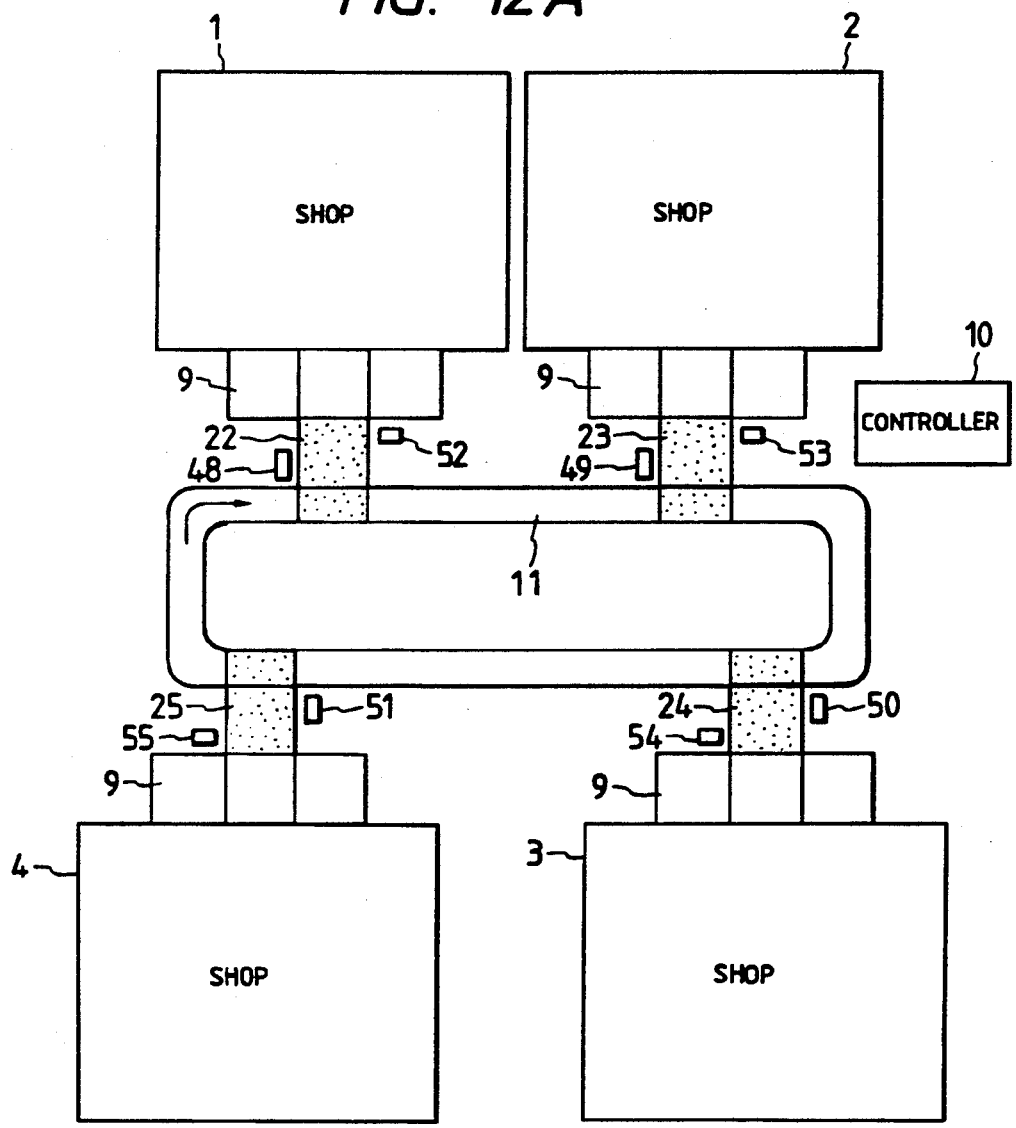
FIG. 12(A) is a conceptual view showing a sixth embodiment of the production system for which the present invention is used.
Figure 12B:
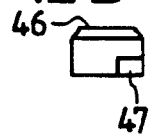
FIG. 12(B) is a view showing lots to be handled.

FIG. 12(A) is a conceptual view showing a sixth embodiment of the semiconductor manufacture apparatus of the present invention, and FIG. 12(B) is a view showing one example of a lot to be handled.

In this embodiment, a recording medium 47 such as an IC card indicating lot progress management information is affixed to the lot 46.

Associated with the lot transporter equipments 22-25 between the shops 1-4 and the main line 11, there are respectively provided read units 48-51 at positions adjacent to the main line 11 for reading the lot progress management information indicated on the respective recording mediums 47.

Also, the multistations 9 of the shops 1-4 are provided with read/write units 52-55, respectively, for reading the lot progress management information on the recording medium 47 and writing information about the processings made by the relevant shop into same.

The lot transporter equipments 22-25, the read units 48-51 associated with the lot transporter equipments 22-25, and the read/write units 52-55 associated with the multistations 9 are all connected to the controller 10 which manages the shops 1-4 and the multistations 9.

In this embodiment, the ring-like main (lot transporter) line 11 transports the lot 46 having the recording medium 47.

When the lot 36 arrives, each of the read units 48-61 reads the lot progress management information indicated on the recording medium 47 of the lot 46, and reports same to the controller 10.

If the first processing shop is the shop 1, for example, the controller 10 sends based on the read result a command to the lot transporter equipment 22 for transferring the lot 46 between same and the shop 1, so that the shop transporter equipment 22 how receives the lot 46.

After receiving the predetermined lot 46, the lot transporter equipment 22 transports it to the multistation 9 of the shop 1.

When the lot 46 arrives the multistation 9 of the shop 1, the read/write unit 52 associated with the multistation 9 checks the lot progress management information indicated on the recording medium 47 of the lot 46, and then reports same to the controller 10.

The multistation 9 of the shop 1 once places the lot 46 in the station (omitted in FIG. 12(A)), withdraw same therefrom, and then sends it to the shop 1 for applying the predetermined processing thereto.

After the shop 1 has applied the predetermined processing to the lot 46, the read/write unit 52 associated with the multistation 9 of the shop 1 writes the completion of processing in the shop 1 on the recording medium 47 and reports it to the controller 10. Then, the multistation 9 of the shop 1 places the lot 46 in the predetermined station and temporarily hold it therein.

Subsequently, if the succeeding processing shop is the shop 2, for example, the controller 10 calculates the quantity of inventory of lot in the shop 2. When the quantity of inventory reaches a proper value, the controller 10 sends a command to the multistation 9 of the shop 1 to eject out the lot 46 therefrom, and another command to the lot transporter equipment 23 associated with the shop 2 to receive the lot 46.

Thereafter, the shops 2, 3 and 4 are controlled in a like manner to the shop 1.

According to this embodiment, respective functions of the recording medium 47 affixed to the lot 46, the read units 48-51, the read/write units 52-55, and the controller 10 can be combined to implement the intricately complicated processes in the form of a production line like an assembly line.

Further, this embodiment is simply adapted for the case of modifying the process sequence for each product group, adding other processes or deleting some processes, and hence suitable for producing many product groups.

Incidentally, the foregoing second through sixth embodiments are similar to the first embodiment in that the machine condition monitoring system, the sampling inspection equipment for evaluation and the reclamation equipment for lot are disposed inside the ring-like main line(s), and that the shops disposed outside the ring-like main line(s), the ring-like main line(s) and the various equipments disposed inside the ring-like main line(s) are interconnected through the lot transporter equipments.

Figure 14A:
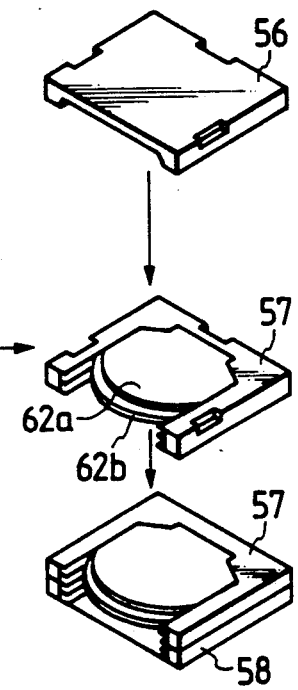
FIGS. 14(A) and 14(B), FIGS. 15(A) and 15(B), and FIG. 16 are views for explaining the operation of storing and taking out respective wafers.
Figure 15A:
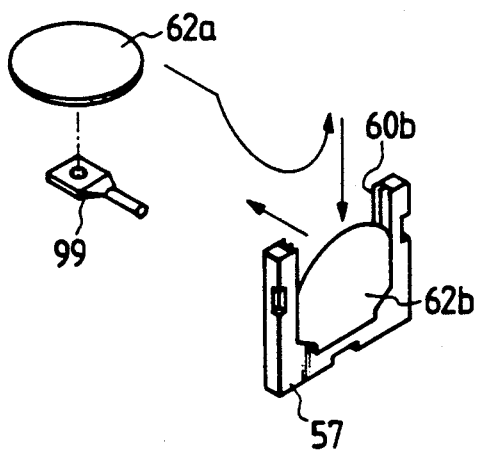
Figure 16:
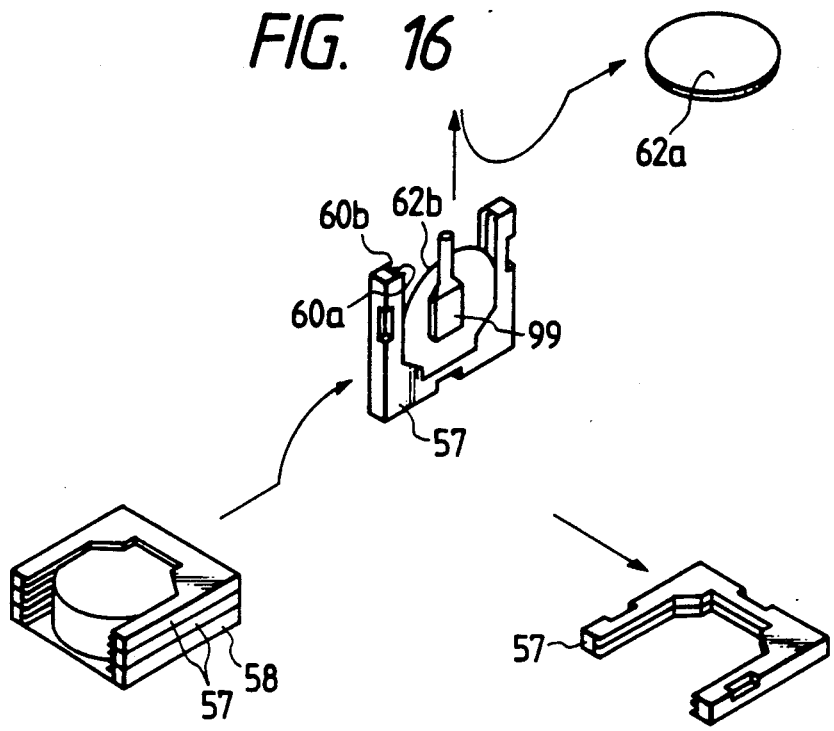
Figure 17:
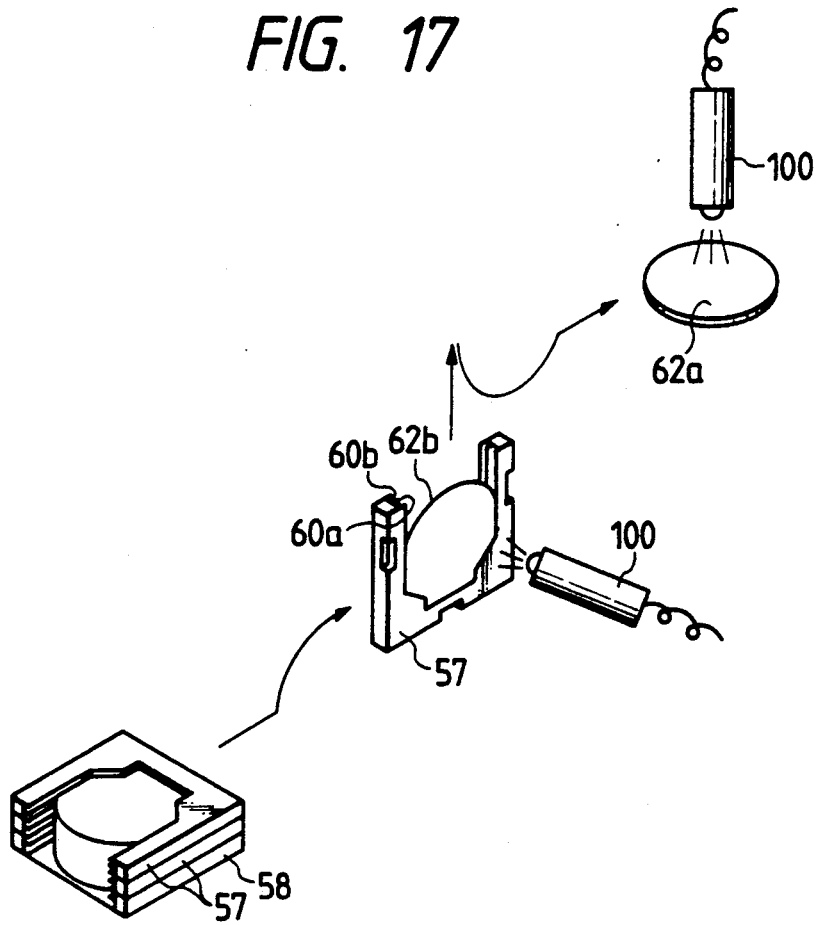
FIG. 17 is a view for explaining the operation of organoleptic test to check the presence or absence of contamination or defect on the wafer surface.

FIG. 13 is a perspective view showing one embodiment of a carrier jig according to the present invention, FIGS. 14(A), (B), FIGS. 15(A), (B), and FIG. 16 are views for explaining the operation of storing and taking out respective wafers, and FIG. 17 is a view for explaining the operation of organoleptic test to check the presence of absence of contamination or defect on the wafer surface.

The wafer carrier jig of this embodiment shown these figures comprises an upper base 56, a carrier 57, and a lower base 58.

As shown in FIG. 13, the carrier 57 has an opening portion 57a formed therein. In the peripheral walls of the opening portion 57a, there are two parallel wafer storage grooves 60a, 60b with a partition wall 61 positioned therebetween. The carrier 57 can store two wagers 62a, 62b (as seen in FIG. 14A) in the wafer storage grooves 60a, 60b, respectively, such that the wafers are located parallel to each other with a gap corresponding to a thickness of the partition wall 61.

The upper and lower bases 56, 58 are each formed into such a outer configuration as superposable with the carrier 57. Also, the upper and lower bases 56, 58 have formed in the bottom and top surface thereof recessed portions 59 of the same shape as the opening portion 57a of the carrier 57.

The case of storing the two wafers 62a, 62b in the carrier 57 in parallel with their front side surfaces facing in the forward direction will now be described with reference to FIGS. 14(A) and 14(B).

Figure 14B:
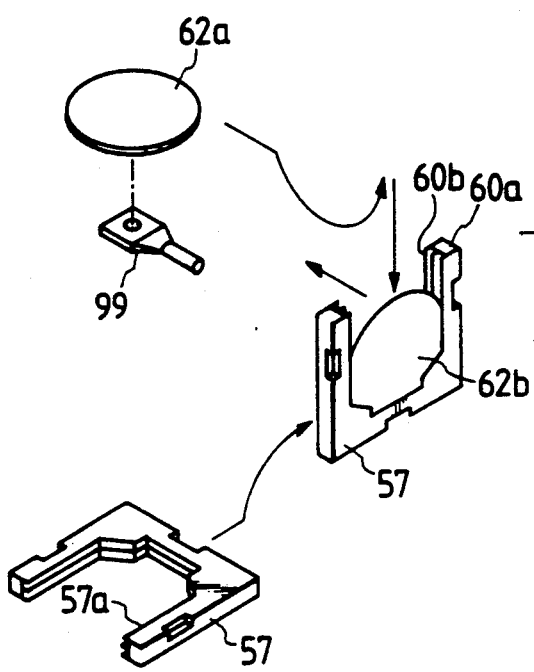

First, the carrier 57 lying horizontally is erected to a vertical posture, as shown in FIG. 14(B).

Then, a vacuum pincette 99 (as seen in FIG. 15A) is used to attract the back side surface of the first wafer 62a by suction, and move the wafer 62a toward the carrier 57 from the side of the wafer storage groove 60b thereof for storing it in the other wafer storage groove 60a. More specifically, as will be seen in FIG. 14(B), the pincette 99 is operated to rotate the wafer 62a through 90° from a horizontal posture to a vertical posture on the side of the wafer storage groove 60a while holding it at the back side surface, so that the wafer 62a is stored in the wafer storage groove 60a with its front side surface facing forward.

Subsequently, in a like manner to the above operation, the second wafer 62b is attracted and held by suction, rotated through 90° and then stored with its front side surface facing forward.

After the two wafers 62a, 62b have been stored in the two wafer storage grooves 60a, 60b of the single carrier 57 with their front side surfaces facing forward, the carrier 57 is rotated through 90° in the predetermined direction from a vertical posture to a horizontal posture as indicated by an arrow between FIGS. 14(A) and 14(B). Following that, the carrier 57 is laid over the top surface of the lower base 58, or over another carrier 57 already stacked on the lower base 58 with the wafers 62a, 62b, stored therein, as shown in FIG. 14(A).

After stacking the arbitrary number of carriers 57 each storing two wafers 62a, 62b one above another, the upper base 56 is superimposed at the top to make up the unitized assembly for transportation and stock in a one-piece state.

The case of storing the two wafers 62a, 62b in parallel with their front side surface facing each other will now be described with reference to FIGS. 15(A) and 15(B).

First, as shown in FIG. 15(A), the vacuum pincette 99 is operated to attract and hold the back side surface of the first wafer 62b by suction, and rotate the wafer 62b through 90° such that its front side surface is facing the backward side of the carrier 57, for storing the wafer 62b in the wafer storage groove 60a.

Figure 15B:
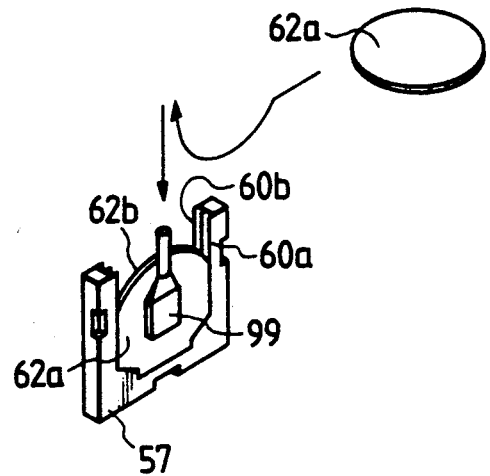

As shown in FIG. 15(B), the vacuum pincette 99 is then operated to attract and hold the back side surface of the second wafer 62a by suction, and rotate the wafer 62b through 90° such that its front side surface is facing forward, for storing the wafer 62a in the wafer storage groove 60a.

By so doing, the two wafers 62a, 62b can be stored in the carrier 57 with their front side surfaces facing each other.

In case of storing the two wafers 62a, 62b in the carrier 57 with their back side surfaces facing each other, this can be effected by rotating the wafers 62a, 62b in the direction opposite to those in the case of FIGS. 15(A) and 15(B) prior to storage thereof into the wafer storage grooves 60a, 60b.

Operation of taking out the wafers 62a, 62b from the carrier 57 will now be described with reference to FIG. 16.

When taking out the two wafers 62a, 62b stored in the wafer storage grooves 60a, 60b of the carrier 57, the carrier 57 is first set into a vertical posture as shown in FIG. 16. The vacuum pincette 99 is then operated to separately attract and hold the back side surfaces of the wafers 62a, 62b by suction, withdraw the wafers 62a, 62b from the wafer storage grooves 60a, 60b, and rotate the wafers 62a, 62b in the predetermined direction such that their front side surfaces are facing upward or downward. Thereafter, the wafers 62a, 62b are laid horizontally in a predetermined position.

As described above, according to this embodiment, the two wafers 62a, 62b can be stored in and taken out from the single carrier 57 using a handling device such as the vacuum pincette 99, and a plurality of carriers 57 each storing the two wafers 62a, 62b can be handled as a stacked one-piece assembly. It is thus possible to improve the efficiency and workability of transportation, storage and stock of wafers between and in the apparatus capable of processing different numbers of wafers from each other.

Also, according to this embodiment, since the upper base 56 and the lower base 58 are superimposed on the top and bottom surfaces of the carrier 57 storing the wafers 62a, 62b to provide covers, respectively, wafers can be prevented from contamination due to airborne dust in the atmosphere during transportation, storage and stock of the wafers.

The case of conducting the organoleptic test on the front side surfaces of the wafers 62a, 62b store in the carrier 57 will now be described with reference to FIG. 17.

When conducting the organoleptic test on the front side surfaces of the wafers 62a, 62b, as will be seen from FIG. 17, either one of the wafers 62a, 62b stored in the wafer storage grooves 60a, 60b of the carrier 57 is first taken out of the carrier 57 using the vacuum pincette (omitted in FIG. 17). Organoleptic test devices 100 are then positioned opposite to the front side surface of the taken-out wafer 62a and the front side surface of the wafer 62b remained stored in the wafer storage groove 60b of the carrier 57 for testing, respectively.

In this embodiment, therefore, the number of times of taking out the wafers stored in the carriers 57 to make the organoleptic test can be reduced to a half the number of wafers, and the organoleptic test can also be improved in workability.

Figure 18A:
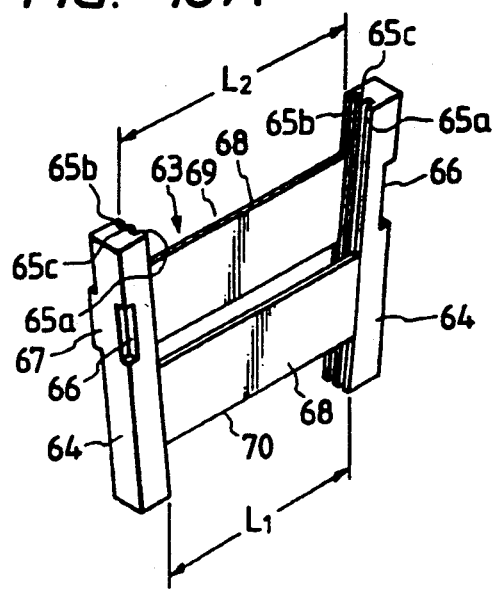
FIG. 18(A) ia a perspective view of a single wafer, showing another embodiment of the present invention.
Figure 18B:
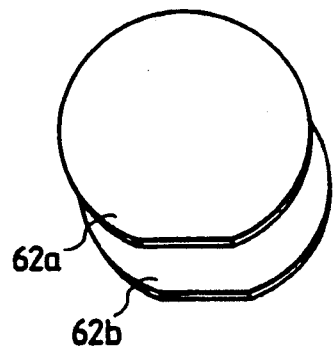
FIG. 18(B) is a perspective view of two wafers stored in a single carrier.
Figure 18C:
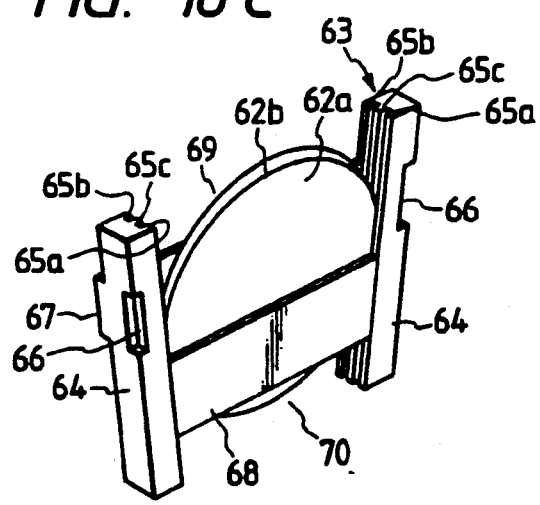
FIG. 18(C) is a perspective view showing the state in which two wafers are stored in a single carrier.
Figure 19:
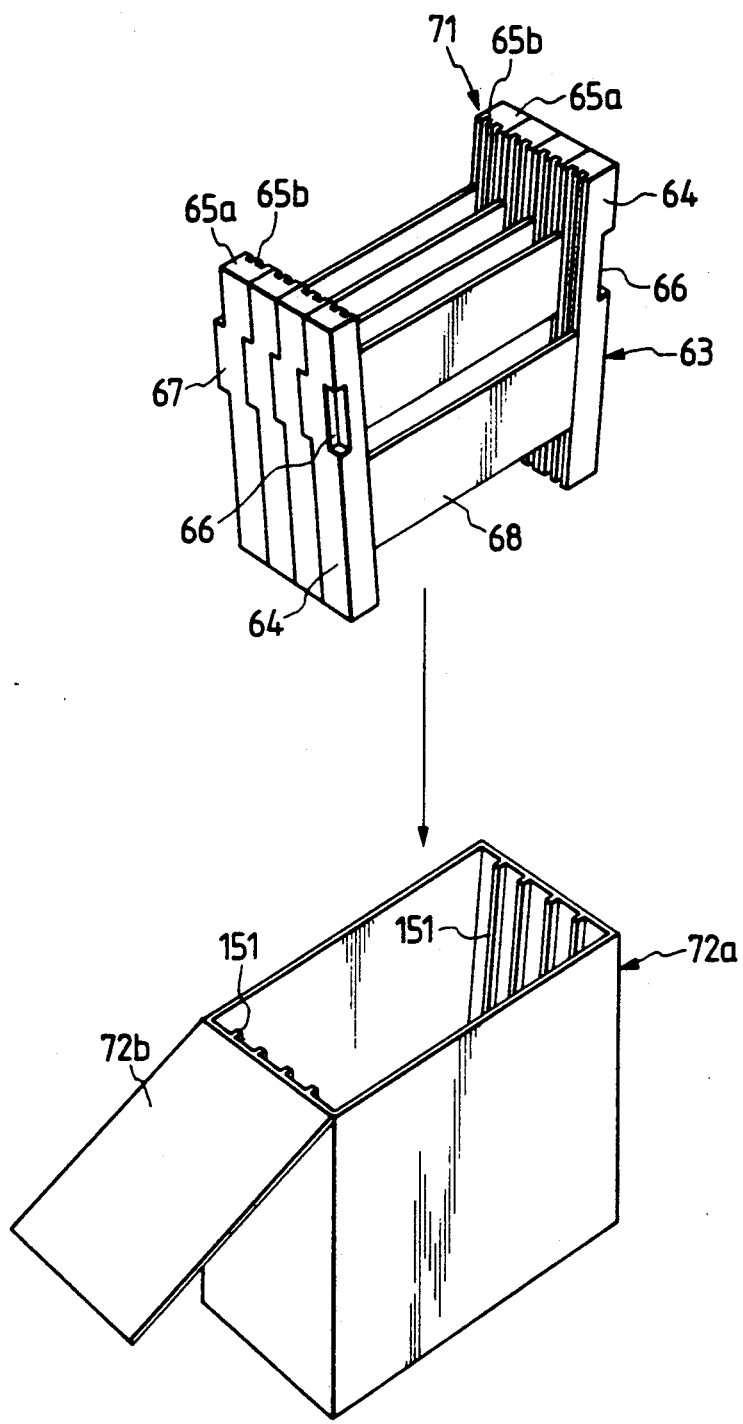
FIG. 19 is a perspective view showing a carrier assembly comprising a plurality of carriers interconnected, and a container box for loading therein the carrier assembly.
Figure 20:
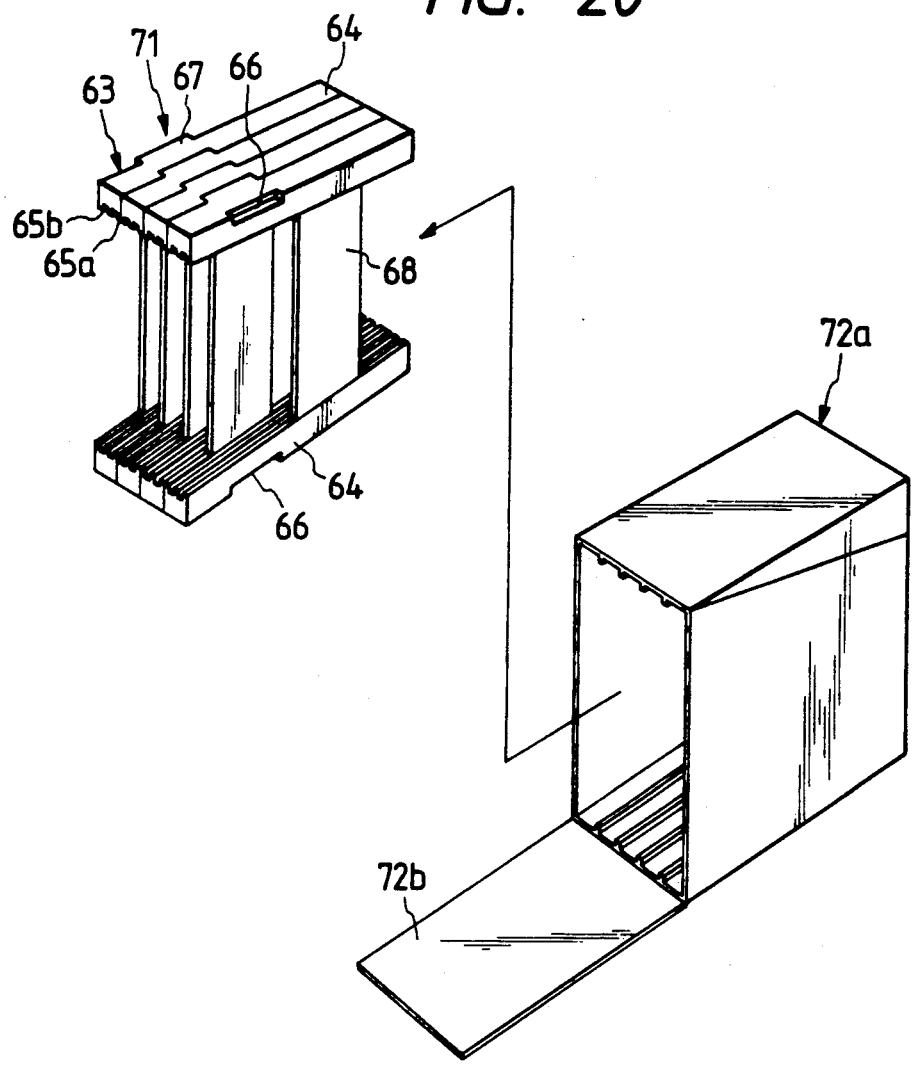
FIG. 20 is a perspective view of the carrier assembly and the container box turned over sidelong.
Figure 21:
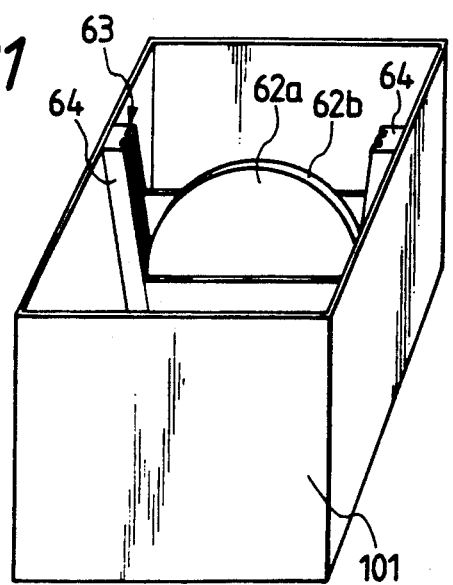
FIG. 21 is a view for explaining the state in which the carrier storing therein wafers is used as a wafer cleaning jig.

Continuing to refer the drawings, FIG. 18(A) is a perspective view of a single wafer, showing another embodiment of the present invention, FIG. 18(B) is a perspective view of two wafers stored in a single carrier, FIG. 18(C) is a perspective view showing the state in which two wafer are stored in a single carrier, FIG. 19 is a perspective view showing a carrier assembly comprising a plurality of carriers interconnected, and a container box for loading therein the carrier assembly, FIG. 20 is a perspective view of the carrier assembly and the container box turned over sidelong, and FIG. 21 is a view for explaining the state in which the carrier storing therein wafers is used as a wafer cleaning jig.

The wafer carrier jib of this embodiment shown in the above drawings is composed of a plurality of carriers 63 and a container box 72a for a carrier assembly 71.

Each carrier 63 comprises two posts 64 and two flat plates 68 in combination. As will be seen from FIGS. 18(A) and 18(C), the carrier 63 is formed to have a larger spacing L2 between the upper ends of the posts 64, than a spacing L1 between the lower ends thereof. Thus, the posts 64, define therebetween an upper opening portion 69 of larger spacing L2 and a lower opening portion 70 of smaller spacing L1.

In the inner side wall of each post 64 of the carrier 63, there are formed two wafer storage grooves 65a, 65b with a partition wall 65c located therebetween. The wafers 62a, 62b are inserted into the wafer storage grooves 65a, and 65b, 65b of the two posts 64, opposite to each other through the opening portion 69 of larger spacing L2 in the state of FIG. 18(A), respectively, so that the wafers 62a, 62b are graspingly held midway the wafer storage grooves and stored therein.

Each post 64 is provided on its outer side with a connector. The connector comprises a recess 66 cut out at the outer corner of the post 64 on the back side, and a boss 67 projecting at the opposite corner thereof on the front side. Carriers can be interconnected into a one-piece assembly by fitting the recesses 66, defined in the two posts 64, 64 of one carrier 63 with the bosses 67, projecting on the two posts 64, of the other carrier 63, respectively.

The two flat plates 68, are disposed between the inner walls of the two posts 64, on the front and back ends, respectively, and in parallel to each other for interconnecting the two posts 64.

As will be seen from FIG. 21, the carrier 63 is formed to have an outer configuration with which it is hooked between the opposite inner walls of a cleaning tank 101. Further, the carrier 63 stored the two wafers 62a 62b in parallel to each other with a gap left therebetween corresponding to the central partition wall 65c and with a pair of parallel gaps between the wafers 62a, 62b and the respective opposite flat plates 68. By setting the carrier 63 with the opening portion 69 of larger spacing L2 facing upward, it also has a vacant space penetrating from the upper opening portion 69 of larger spacing L2 to the lower side end of smaller spacing L1. As a whole, the interior of the carrier 63 is constructed to restrict a cleaning solution from causing turbulence at the water surfaces during the step of cleaning.

A plurality of carriers 63 can be interconnected into the one-piece assembly 71 as shown in FIGS. 19 and 20 with the aid of their connectors each comprising the recesses 66 and the bosses 67 in combination.

The carrier assembly 71 is demonstrated to be loaded in the container box 77a as shown in FIGS. 19 and 20.

As shown in FIGS. 19 and 20, the container box 72a is formed into an enclosed box with a lid 72b attached to close one surface thereof. In each of the opposite inner side walls of the container box 72a, there are provided a plurality of ribs 151 for fixing the individual carriers.

Two wafers 62a, 62b shown in FIG. 18(B) are stored in the carrier 63 as follows. First, as shown in FIG. 18(A), the carrier 63 is vertically erected with the opening portion 69 of larger spacing L2 facing upward. In a like manner to the embodiment shown in FIGS. 13-16, a handling device such as a vacuum pincette is then used to insert the first wafer 62a between the wafer storage grooves 65a, 65a of the carrier 63 such that it is latched therebetween. Subsequently, the second wafer 62b is inserted between the wafer storage grooves 65b, 65b of the carrier 63 such that it is latched therebetween. As a result, the wafers are stored in the carrier 63 in parallel to each other with a gap left therebetween, as shown in FIG. 18(C).

In case of storing every two wafers 62a, 62b in each carrier 63 and stocking a plurality of carriers 63 thus occupies with wafers, the recesses 66, defined in the posts 64, of one carrier 57 are fitted with the bosses 67, projecting on the posts 64, of another carrier 63, respectively, as shown in FIG. 19. Thus, the arbitrary number of carriers 63 are sequentially interconnected through their connectors to make up the carrier assembly 71.

The carrier assembly 71 is then put in the container box 72a as shown in FIG. 19. After closing the lid 72b, the container box 72a is transported to a predetermined place for stock. Incidentally, the wafers are omitted in FIG. 19.

As will be apparent from the above description, according to this embodiment, it is also possible to improve the efficiency and workability of transportation, storage and stock of wafers, as well as to prevent contamination of wafers during transportation, storage and stock, similarly to the foregoing embodiment shown in FIGS. 13-16.

Next, when taking out the wafers from the container box 72a for processing, the container box 72a is turned over sidelong by way of example as shown in FIG. 20. In that state, the lid 72b is opened and the carrier assembly 71 is withdrawn out of the container box 72a. Incidentally, the wafers are omitted in FIG. 20 as well.

When cleaning the wafers after processing, the carrier assembly 71 is first disassembled into the individual carriers 63 storing wafers. The carriers 63 each storing the two wafers 62a. 62b are individually set inside the cleaning tank 101 one by one, as shown in FIG. 21, and a cleaning solution is poured onto the wafers for cleaning.

At this time, since the interior of the carrier 63 is constructed to restrict the cleaning solution from causing turbulence at the wafer surfaces in this embodiment, the wafers 62a, 62b can effectively be cleaned as they remain stored in the carrier 63.

Further, the organoleptic test on the surfaces of the wafers 62a, 62b can be conducted by taking out either of the two wafers 62a, 62b stored in each carrier 63 and positioning the organoleptic test devices opposite to the respective surfaces of the wafers 62a, 62b, in a like manner to the foregoing embodiment shown in FIGS. 13-16 described in connection with FIG. 17.

It is to be noted that the connectors of the carrier 63 are not limited to the illustrated ones in the above embodiment shown FIGS. 18(A), (C)-20, and they may be formed into any other suitable structures.

In addition, although the illustrated embodiments have been described as storing two wafers in a single carrier, the present invention is not limited thereto and of course applicable to a carrier storing one or three wafers. Essential is that each carrier is constructed to store a few wafers.

Figure 22:
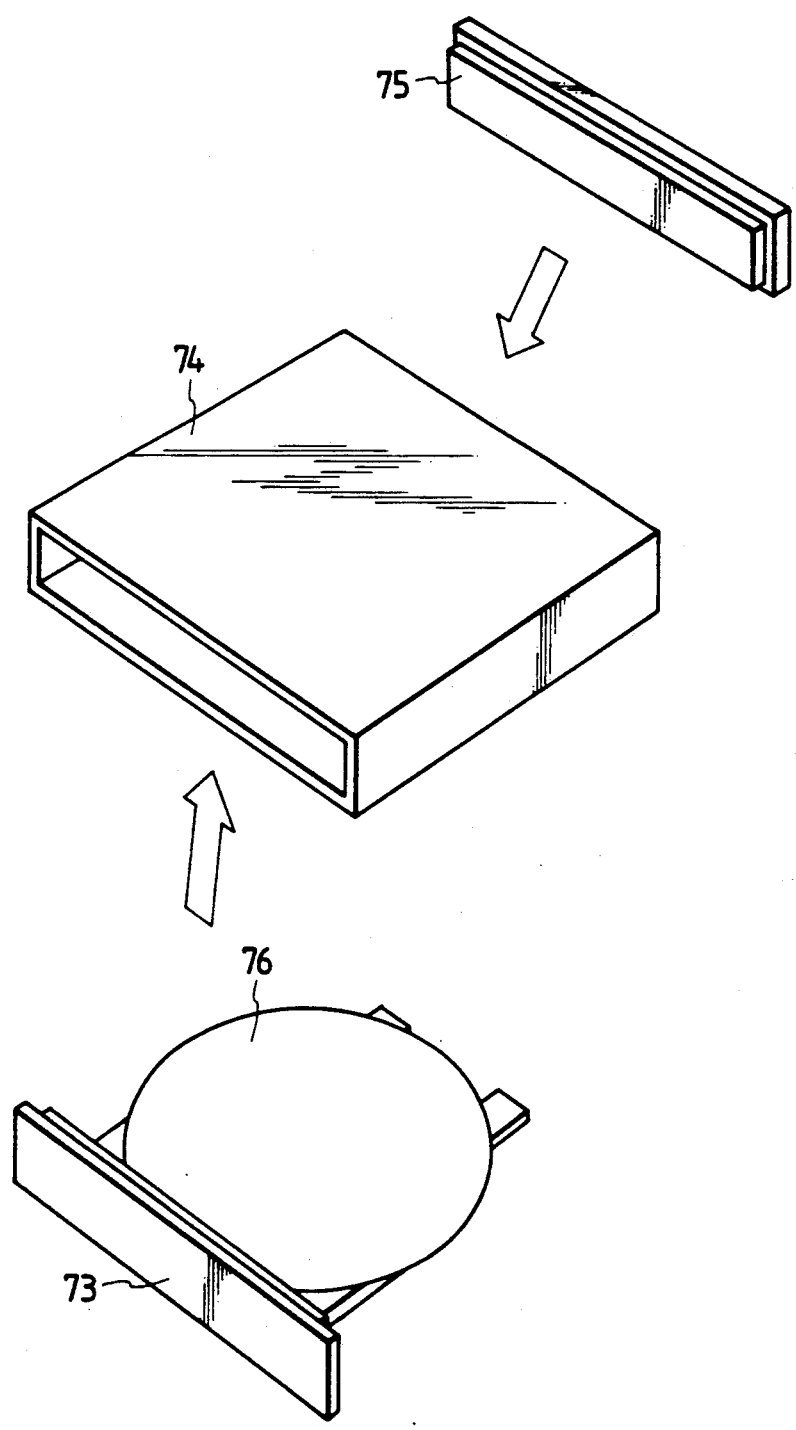
FIG. 22 is a view showing the carrier construction according to the present invention.

FIG. 22 is a view showing the construction of a wafer carrier jig of integral type. This wafer carrier jig comprises a wafer chucking lid 73 serving to hold and store a wafer 76 thereon, a jig body 74, and a back lid 75, the wafer 76 being held on the lid 73 in FIG. 22. The lid 73 with the wafer 76 held thereon is gripped at its holder by a robot, manipulator, or the like and then enclosedly fitted to the jig body 74 secured to a rest such as an XY table. The back lid 75 is then enclosed fitted to the jig body 74 on the opposite side. But, before assembly, all the components should be cleaned to eliminate any dust such as particles. This enables to protect the wafers against contamination due to dust during transportation and stock. On the other hand, when the lid 73 is gripped and removed from the jig body 74, the wafer 76 can be handled via surrounding spaces in three direction except for one direction in which the lid 73 is fitted to the jig body 74. Thus, the wafer handling operation can be automated to improve workability. In such case, the lid 73 and the wafer 76 are held as a unit at two or three points around the circumference of the wafer. Possible offset in the wafer position during transportation can be coped be defining a recess in the wafer holding area of the lid 73. The occurrence of dust due to contact with the wafer 76 can be prevented by applying a coating of Teflon or any other suitable material.

Figure 23:
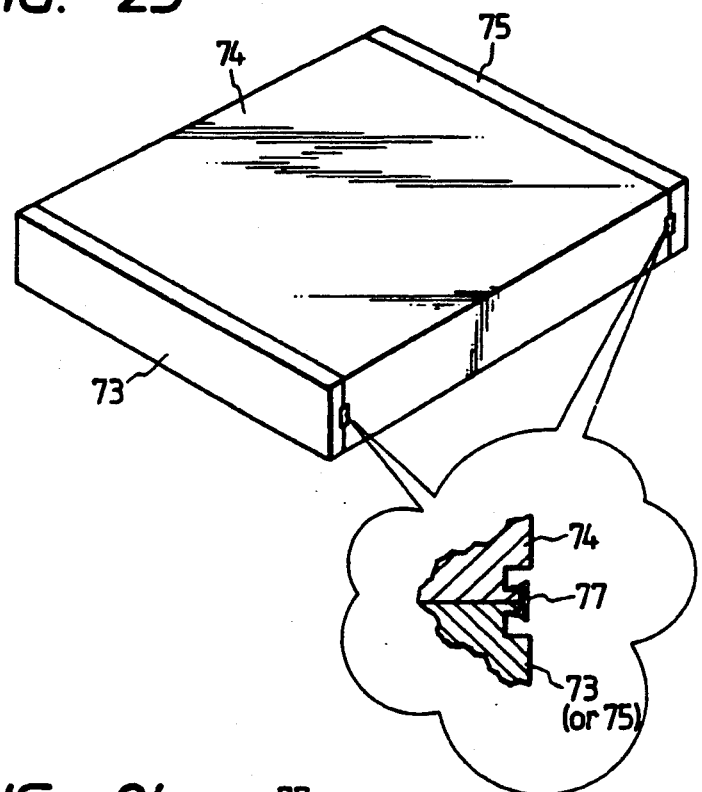
FIG. 23 is an appearance view of the carrier of FIG. 22.

FIG. 23 is an appearance view of the wafer carrier jig of the integral type enclosed using clips or the like.

Specifically, FIG. 23 shows the state in which the wafer chucking lid 73 serving to hold and store a wafer and the back lid 75 are enclosedly fitted to the jig body 74 using clips 77. For example, clips made of steel are used to fix between the jig body 74 and the lid 73 and between the jig body 74 and the back lid 75 in closely contact relation. To this end, as shown in a partially enlarged illustration of FIG. 23, the jig body 74, the lid 73 and the back lid 75 are provided at their four or two corners, for example, with four pairs bosses over which the clips 77 are graspingly fitted to fix those components in closely contact relation. Before such assembly, the jig body 74, the lid 73 and the back lid 75 should be cleaned to eliminate any dust such as particles, thereby ensuring to keep cleanness inside the wafer carrier jig. Thus, by enclosing the wafer carrier jig, cleanness inside the jig can be maintained without being subjected to contamination by the atmosphere surrounding the jig.

When taking out or storing the wafer, only two clips used for enclosedly fixing between the jig body 74 and the lid 73 require to be removed or attached. When processing of the wafer has been completed, or it is found that the interior of the jig has become heavily contaminated, all the components can be reused by disassembling the back lid 75 as well as the lid 73 from the jig body 74, and then cleaning them to restore the initial cleanness.

The structure of the carrier will be described blow in detail with reference to FIGS. 24 to 32.

Figure 24:
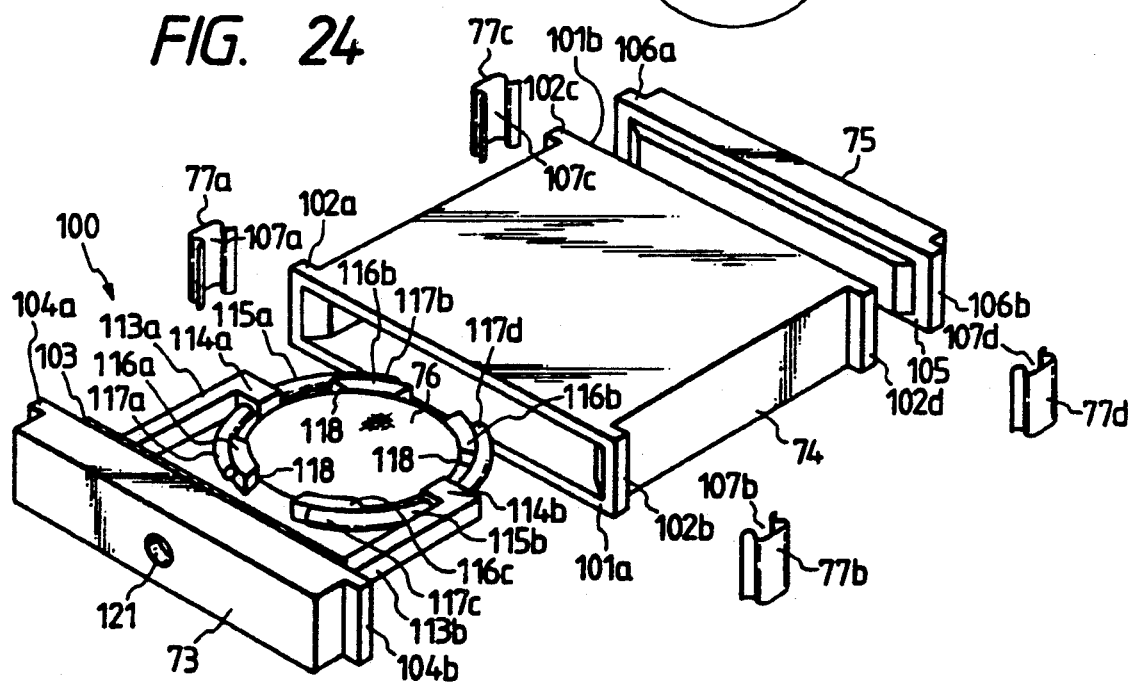
FIG. 24 is an exploded perspective view of the carrier according to the present invention.

In FIG. 24, the carrier body 24 is open-ended at both sides and has end faces 101a, 101b with which an inner end face 103 of the top lid 73 and an inner end face 105 of the bottom lid 25 are engaged in close contact relation, respectively. The carrier body 74 has flanges 102a-102d provided at both sides of the end faces 101a and 101b. Also, the top lid 73 has a pair of flanges 104a, 104b at both sides of the inner end face 103, and the bottom lid 75 has a pair of flanges 106a, 106b at both sides of the inner end face 105. The flanges 102a and 104a, 102b and 104b, 102c and 106a, and 102d and 106b are gripped in pairs by clips 77a, 77b, 77c and 77d, respectively, the top lid 73 and the bottom lid 75 are fixed to the carrier body 74 and the carrier body 74 is enclosed. By selectively attaching and detaching the clips 77a-77d over the pairs of flanges, it is possible to attach and detach only the top lid 73, only the bottom lid 75, or both the top and bottom lids 73, 75 with respect to the carrier body 74 as desired. The clips 77a-77d are formed to have respective opening portions 107a-107d for providing some elasticity, so that the clips can fit over the pairs of flanges 102a and 104a, 102b and 104b, 102c and 106a, and 102d and 106b via their opening portions 107a-107d, thereby securely grasping the respective pairs of flanges.

Moreover, when the bottom lid 75 is fitted to the carrier body 74 and the top lid 73 is fitted to the carrier body 74, a holder portion 100 provided in the top lid 73 is also accommodated in the carrier body 74. SO, if the holder portion 100 holds thereon the wafer 76, the wafer 76 is also simultaneously loaded into the carrier body 74.

Several embodiments of the holder portion 100 for holding the wafer 76 will be described below in detail.

Figure 25:
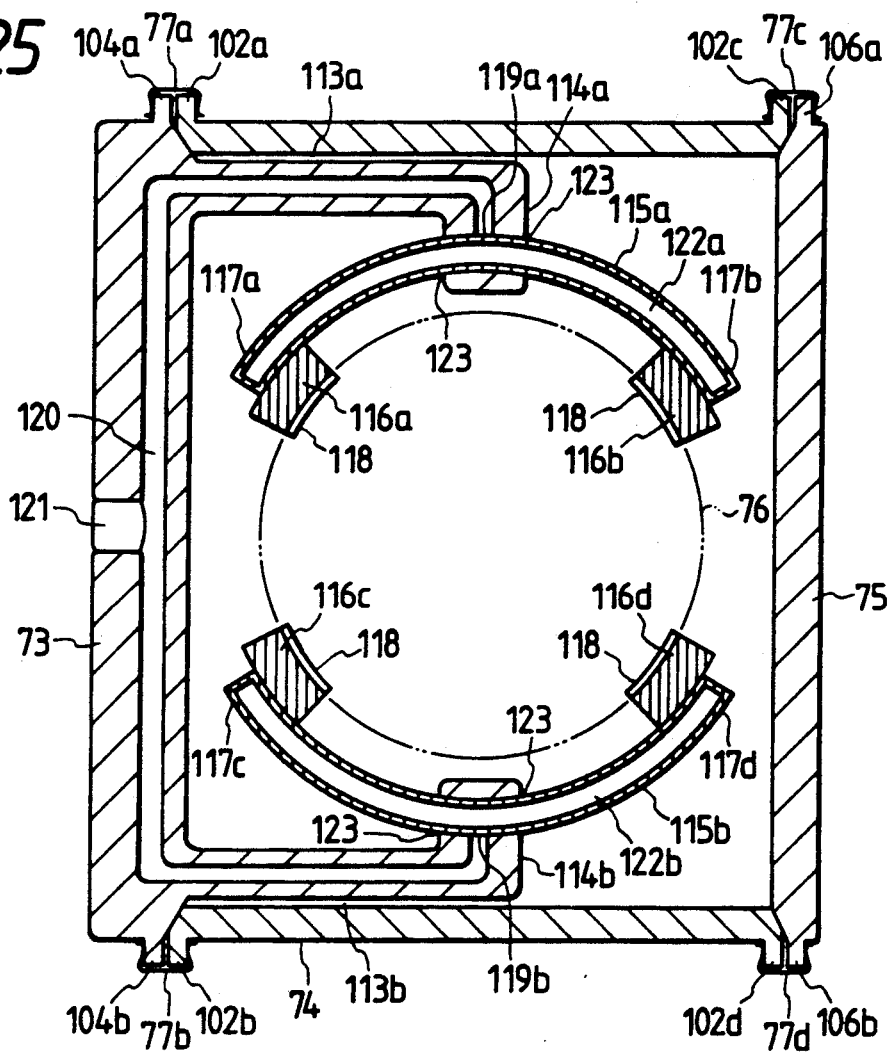
FIG. 25 is a cross-sectional view of a carrier body of FIG. 24 with top and bottom lids fitted thereon.

FIG. 24 shows in a perspective the holder portion 100 utilizing the principles of a Bourdon's tube, and FIG. 25 shows a cross section thereof.

A pair of members 113a, 113b are extending from the inner end face 103 of the top lid 73 and have their distal ends 114a, 114b to which pipes 115a, 115b of elliptic section are attached to their central parts in fitting relation, respectively. The pipes 115a, 115b are disposed around the outer circumference of the wafer 26 and each formed into an arcuate shape. The pipes 115a, 115b have their closed both ends 117a, b and 117c, d with spacings left between the opposite ends 117a and 117c and between 117b and 117d, and are provided near the ends 117a-117d with respective pawls 116a-116d engageable with the wafer 76. Each of the pawls 116a-116d has a U-shaped groove 118 formed therein. As will e seen from FIG. 25, the pipes 115a, 115b are formed of thin-walled pipes and closed at their both ends 117a-117d, leaving only pipe ports 119a, 119b open. The pipe ports 119a, 119b are communicated with a pipe line 120 passing through the members 113a, 113b and leading to an air port 121 defined in the top lid 73. Thus, the air port 121 is communicated with hollow spaces 112a, 122b of the pipes 115a, 115b via the pipe line 120 and the pipe ports 119a, 119b. With the holder portion thus constructed, when compressed air is supplied into the top lid 73 through the air port 121, the compressed air flow into the hollow spaces 122a, 122b of the pipes 115a, 115b from the pipe ports 119a, 119b via the pipe line 120. As the pressures in the pipes 115a, 115b are thus raised, their cross sections tend to change from an elliptic shape to a circular shape, so that the radii of curvatures of the pipes 115a, 115b are increased and their free ends 117a–117d are caused to move outward. At this time, the pawls 116a–116d are also moved together with the free ends 117a–117d. To the contrary, when the pressures in the pipes 115a, 115b are lowered, the free ends 117a–117d are caused to move inward. Accordingly, the holder portion 100 can naturally hold the wafer 76 without the need of supplying compressed air, by designing the holder portion 100 such that the pawls 116a–116d with the U-shaped groove 118 can hold the wafer 76 under the atmospheric or thereabout, and can release the wafer 76 from its held state upon application of air under a certain pressure higher than the atmospheric pressure.

A second embodiment of the holder portion 100 will now be described with reference to FIGS. 26 and 27.

Figure 26:
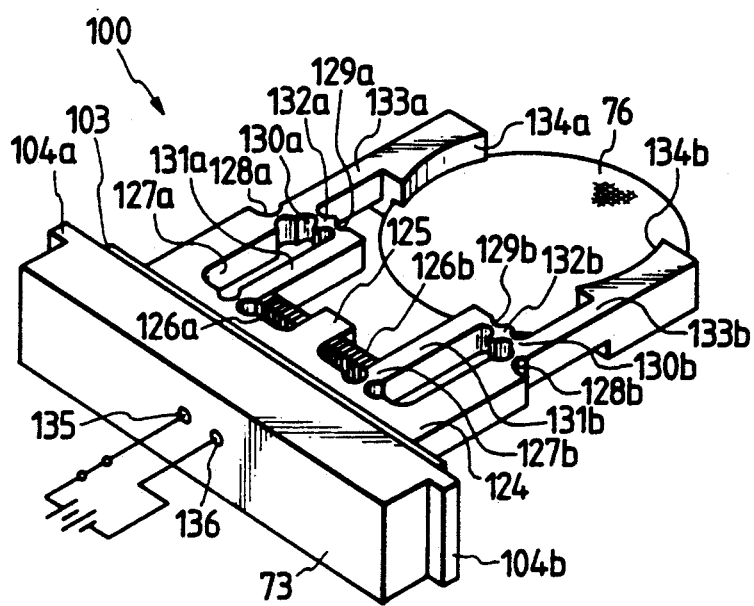
FIG. 26 is a perspective view of another embodiment of the carrier according to the present invention.

FIG. 26 is a perspective view of a top lid 73 and a holder portion 100 according to this embodiment of the present invention, and FIG. 27 is a perspective view a rectangular parallelpiped hinge used for the holder portion 100 shown in FIG. 26. In FIG. 27, a rectangular parellelpiped hinge a is formed by defining a pair of U-shaped cut-out portions a3 on both lateral sides of substantially central portion of a rectangular parallelpiped member having high rigidity. Designated as a1, a2 are rigid portions on both sides of the cut-out portions a3, and at a4 is a thin-walled portions defined between the opposite cut-out portions a3. Designated at A is an axis passing through the center of the thin-walled portion a4 and extending parallel to the wall surfaces of the cut-out portions a3.

As to the rectangular parallelpiped hinge a thus formed, assuming now that one rigid portion a1 is fixed and a force in the direction of an arrow B perpendicular to the axis A is acted on the rigid portion a2, the thin-walled portion a4 flex easily and the other rigid portion a2 is caused to turn about the axis A. However, the thin-walled portion a4 exhibits high rigidity against forces or moments in other directions. The holder portion 100 shown in FIG. 26 is constituted using such rectangular parallelpiped hinge a.

In FIG. 26, the top lid 73 has a pair of flanges 104a, 104b and includes the holder portion 100 on the side of its inner end face 103. FIG. 26 illustrates the state in which the wafer 76 is held on the holder portion 100. A supporting member 124 extending from inner end face 103 of the top lid 73 is connected to input members 131a, 131b through cutout portions 127a, 127b and output members 133a 133b through cut-out portions 128a, 128b, respectively. The input members 131a, 131b are connected to intermediate members 132a, 132b through cut-out portions 129a, 129b, respectively. Also, the intermediate members 132a, 132b are connected to output members 133a, 133b through cut-out portions 130a, 130b, respectively. Designated at 126a, 126b are laminated piezoelectric actuators each of which has its opposite end faces held in close contact with a central projection 125 of the supporting member 124 and the input member 131a or 131b. By energizing the piezoelectric actuators 126a, 126b, the input members 131a, 131b connected to the supporting member 124 are caused to turn. Note that the piezoelectric actuators 126a, 126b are electrically connected to respective electric contacts 135, 136 provided on the outer surface of the top lid 73. Thus, by applying voltage across the electric contacts 135, 136, the piezoelectric actuators 126a, 126b are energized to expand or contract in the longitudinal direction thereof.

Further, the output members 133a, 133b are respectively provided with pawls 134a, 134b engageable with the wafer 76.

With the holder portion thus constituted, it is now assumed that the piezoelectric actuators 126a, 126b for driving the input members 131a, 131b are energized to be expanded. In this case, the input members 131a, 131b are caused to turn outward about the cut-out portions 127a, 127b, respectively, and hence the output members 133a, 133b are also caused to turn outward about the cut-out portions 128a, 128b via the intermediate members 132a, 132b as well as the cut-out portions 129a, 129b and 130a, 130b on both sides thereof, respectively. This causes the pawls 134a, 134b to release the wafer 76 from its held state. On the contrary, when the piezoelectric actuators 126a, 126b are energized to be contracted, the output members 133a, 133b are caused to turn inward thereby hold the wafer 76.

Here, the designing the holder portion such that the pawls 134, 134 can hold the wafer 76 while the piezoelectric actuators 126a, 126b are not being energized, i.e., no voltage is being applied across the electric contacts 135 and 136, the holder portion 100 can naturally hold the wafer 76 for transportation without the need of applying the drive voltage. Only when it is desired to remove the wafer 76 from the holder portion 100, certain voltage needs to be applied across the electric contacts 135 and 135.

A third embodiment of the holder portion 100 will now be described with reference to FIGS. 28 and 29.

FIG. 28 is a perspective view of a top lid and a holder portion according to the third embodiment of the present invention, and FIG. 29 shows a view of FIG. 28 in top plan and cross section simultaneously in its lower and upper halves, respectively.

A top lid 73 has a pair of flanges 104a, 104b and includes a holder portion 100 on the side of its inner end face 103. The holder portion 100 has a member 143 extending from the inner end face 103, the member 143 being provided at its free end side with a pair of bifurcated projecting portions 144a, 144b. An arcuate end surface 145 is formed over the projecting portions 144a and 144b at the side of the member 143, as well as the inner end of the member 143, while the projecting portions 144a, 144b have opening portions 146a, 146b formed on their upper surfaces, respectively. The opening portions 146a, 146b are connected to a pipe line 147 defined through the projecting portions 144a, 144b and the member 143. Designated at 148 is a hollow cavity formed in the top lid 73 and communicating with the pipe line 147. A compressed spring 149 and a ball 150 are accommodated in the cavity 148, and a member 155 is fixedly fitted to prevent the compressed spring 149 and the gall 150 from springing out of the cavity 148. The ball 150 is normally held in close contact with the member 155 by a restoring force of the compressed spring 149. A hold 156 is formed through the member 155.

The case of holding the wafer 76 with the holder portion thus constructed will first be described. By putting the wafer 76 on the projecting portions 144a, 144b in abutment with the arcuate end face 145, the wafer 76 is positioned in place with respect to the holder portion 100. In this state, a tubular member is operated by mechanical means to penetrate through the hold 156, thereby pushing the ball 150 so that it is now detached from the member 155. A vacuum device is then operated to evacuate air within the pipe line 147 through the tubular member, whereupon the pressure in the pipe line 147 is lowered below the atmospheric pressure so that the wafer 76 is attracted via the opening portions 146a, 146b under vacuum and held in close contact with the projecting portions 144a 144b. Thereafter, when the tubular member is withdrawn from the hold 156, the ball 150 is brought into close contact with the member 155 again by restoring force of the compressed spring 149. Thus, the pressure in the pipe line 147 is maintained under vacuum, and hence the holder portion 100 naturally hold the wafer 76 continuously.

The wafer 76 thus held under vacuum is released from its attracted state by driving the mechanical means to cause the tubular member to pierce through the hold 156, thereby pushing the ball 150 inward so that the pressure in the pipe line 147 becomes the atmospheric pressure.

Figure 30:
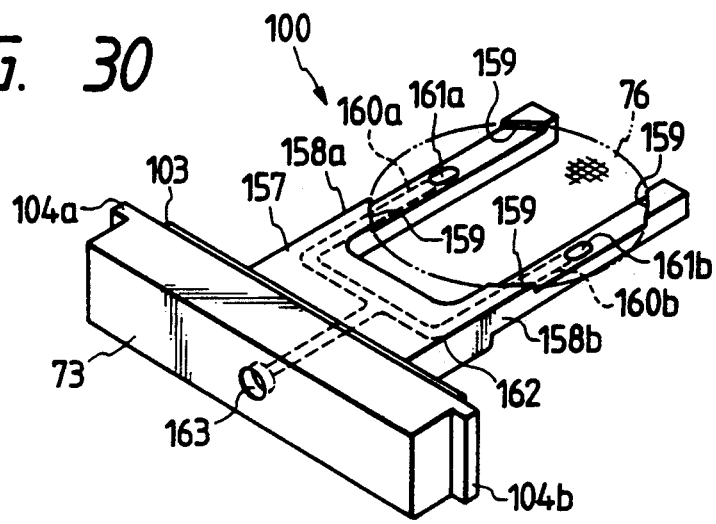
FIGS. 30 and 31 are perspective view of still further embodiments of the carrier according to the present invention.

A fourth embodiment of the holder portion will now be described with reference to FIG. 30. FIG. 30 is a perspective view of a top lid 73 and a holder portion 100 according to this embodiment. In the figure, the top lid 73 has a pair of flanges 104a, 104b and includes the holder portion 100 on the side of its inner end face 103. The holder portion 100 has a member 157 extending from the inner end face 103, the member 157 being provided at the free end side thereof with a pair of bifurcated projecting portions 158a, 158b. The holder portion 100 also has end faces 159 on the projecting portions 158a, 158b, which serve to prevent a lateral offset of the wafer 76 and position the wafer 76 in place with respect to the holder portion 100. The projecting portions 158a, 158b have opening portions 161a, 161b defined in their upper surfaces 160a, 160b, respectively. Designated at 162 is a pipe line which is formed through the member 157 and the projecting portions 158a, 158b for connection with the opening portions 161a, 161b defined in the projecting portions 158a, 158b. Designated at 163 is a pipe port of the pipe line 16.

With the holder portion thus constructed, by putting the wafer 76 on the upper surfaces 160a, 160b of the projecting portions 158a, 158b, the wafer 76 is positioned with the aid of the end surfaces 159 in place with respect to the holder portion 100. A vacuum pump or the like is operated to evacuate air within the line 162 through the pipe port 163 to lower the pressure in the pipe line 162, so that the wafer 76 is attracted and held under vacuum via the opening portions 161a, 161b. Thus, the wafer 76 continues to be attracted and held in place as long as the pressure in the pipe line 162 is maintained by a vacuum pump or the like below the atmospheric pressure, while the wafer 76 is released from its held state by returning the pipe port 163 to the atmospheric pressure.

Figure 31:
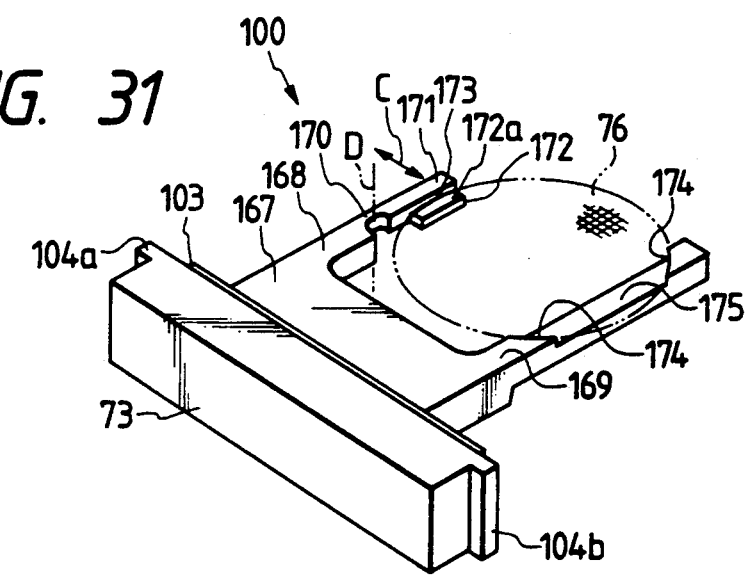

A fifth embodiment of the holder portion will now be described with reference to FIG. 31. FIG. 31 is a perspective view of a top lid 73 and a holder portion 100 according to this embodiment. In the figure, the top lid 73 has a pair of flanges 104a, 104b and includes the holder portion 100 on the side of its inner end face 103. The holder portion 100 has a member 167 extending from the inner end face 103, the member 167 being provided at the free end side thereof with a pair of bifurcated projecting portions 168, 169. The projecting portion 168 has formed therein a thin-walled portion 170 through which a member 171 is connected to the member 167. The thin-walled portion 170 has lower rigidity than that of the adjoining members 168, 171 in the directions of a double-headed arrow C. So, when a force or moment in the directions of C acts on the member 171, the thin-walled portion 170 is caused to elastically flex in the directions of C, thus allowing the member 171 to be turned in the same directions. The member 171 has a ledge 172 formed in tis inner wall surface 173.

Designated at 174 is a vertical surface formed on the projecting portion 169 and capable of abutting with the outer periphery of the water 76. At 175 is a flat surface extending between a pair of vertical surfaces 174 and lying at the same level as an upper surface 172a of the ledge 172.

With such construction, the holder portion 100 can naturally hold the wafer 76. The wafer 76 can be held and released from its held state as follows.

The member 171 is turned by some mechanical means outward, i.e., in one of the directions of C away from the opposite projecting portion 169, and the wafer 76 is put on both the upper surface 172a and the surface 175. The, the member 100 is turned toward the opposite projecting portion 169 so that its inner side wall 173 comes into abutment with the outer periphery of the wafer 76, and an elastic force produced at the thin-walled portion 170 brings the outer periphery of the wafer on the opposite side into abutment with the vertical surfaces 174. Therefore, the holder portion 100 can naturally hold the wafer 76 held between the side wall 173 and the vertical surfaces 174 under the elastic restoring force of the thin-walled portion 170. Incidentally, the wafer 76 can easily be released from its held state by turning the member 171 in one of the directions of C away from the projecting portion 169.

Figure 32:
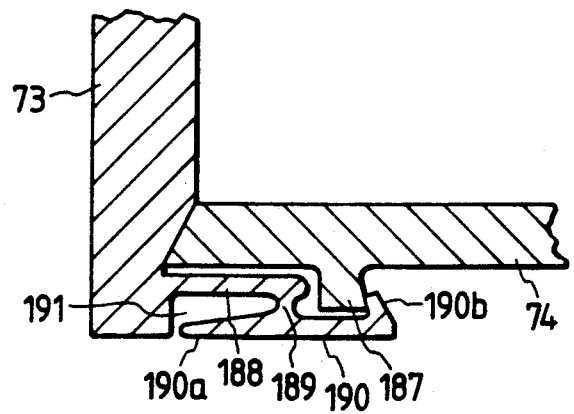
FIG. 32 is a cross-sectional view of the embodiment of FIG. 31.

In the foregoing embodiments, the top and bottom lids are attached to the carrier body using the clips 72a–72d as shown in FIGS. 24 and 25. Alternative means for attaching those lids without using clips is shown in FIG. 32 which shows a cross sectional thereof. In FIG. 32, designated at 74 is a carrier body and at 73 is a top lid, the top lid 73 being attached to the carrier body 74 in close contact relation. Designated at 187 is a boss formed on the carrier body 74. At 190 is a lock member which is connected through a throat portion 189 near at its center to a member 188 extending from the top lid 73. The throat portion 189 is thin-walled with a pair of U-shaped cut-outs on both lateral sides, so that it has lower rigidity about the axis extending normal to the drawing sheet than the member 188 and the lock member 190 adjoining. The lock member 190 has at one end thereof a pawl 190b formed to be engageable with the boss 187 on the carrier body 187, and at the other end thereof a pushing portion 190a. An open space 191 is defined between the member 188 and the pushing portion 190.

With such attachment structure, by pressing the pushing portion 190 upward in the drawing sheet by the operator's finger on any suitable mechanical means in the illustrated state, the lock member 190 is turned clockwise about the throat portion 189 so that the pawl 190b is released from its engagement with the boss 187.

In this released state, by moving the top lid 73 or the carrier body 74 laterally in the drawing sheet, the carrier body 74 and the top lid 73 are separated from each other. To the contrary, in the state where the pushing portion 190a is pressed upward in the drawing sheet and hence the pawl 190b is turned clockwise, by fitting the upper lid 73 and the carrier body 74 as shown and releasing the upward pressing force from the pushing portion 190a, the pawl 190b is caused to turn counterclockwise and come into engagement with the boss 187 as shown, so that the top lid 73 is positively attached to the carrier body 74.

Although FIG. 32 illustrates an example of attaching the top lid 73 to the carrier body 74, the bottom lid 75 can also be attached to the carrier body 74 in a like manner to FIG. 32. Therefore, the example of attaching the bottom lid 75 to the carrier body 74 will not be illustrated and described here.

Figure 33:
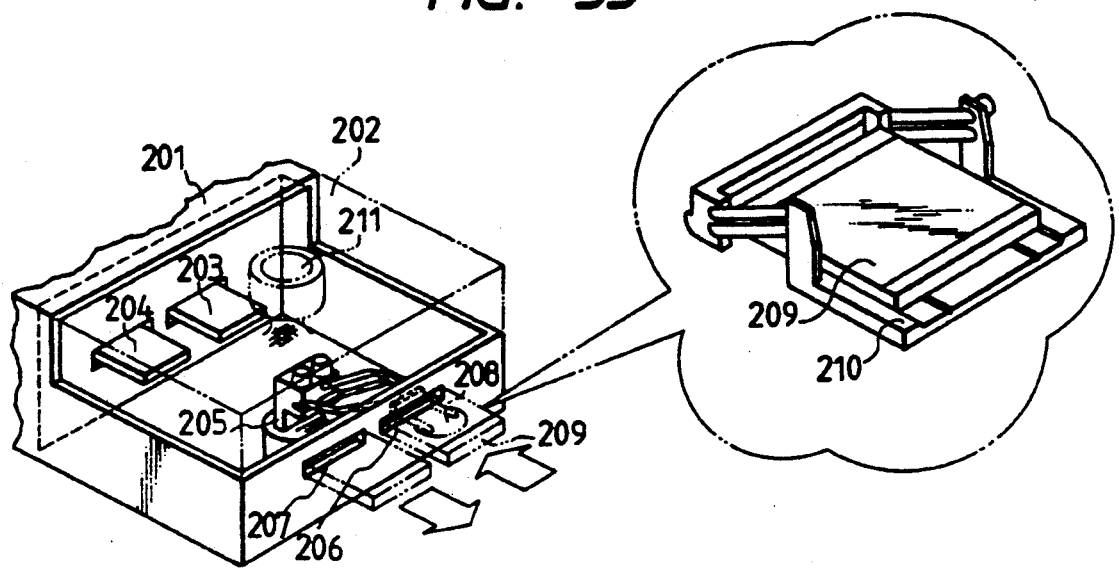
FIG. 33 is a view showing the construction of a wafer transfer unit for loading and unloading carriers to and from the equipment.

FIG. 33 is an overview of a wafer transfer unit for loading and unloading carriers to and from the equipment. When loading a carrier 209 for us in the present invention through a wafer receive port 206 of a clean box 202, the carrier 206 is first placed on a carrier slide guide 210 at the wafer receive port 206. The carrier 206 is then sent into the clean box 209 over the slide guide 210. The carrier 209 thus loaded starts preparing to take out a wafer 208 therefrom at a position where a front lid 73 (as seen in FIG. 22) can be separated from the carrier body 74 for removal of the wafer. Specifically, the parts (such as steel-made clips 77, (as seen in FIG. 22) fitted on the carrier 209 for fixing the front lid 73, serving also as a wafer holder, and the carrier body 74 in close contact relation are removed and, at the same time, the front lid 73 serving also as a wafer holder is gripped positively. For the purpose of eliminating any dust such as particles adhering onto the front lid 73, the lid is subjected to clean air supplied through a clean air intake 211 defined in the clean box 202. Then, the gripped front lid 73 of the carrier 209 is withdrawn from the carrier body and the wafer 208 lying on the front lid as a wafer holder too is transferred onto a wafer loader 203 of an equipment 201 by a wafer charger 205. Thereafter, the wafer 208 having been processed is provided onto a wafer unloader 204 of the equipment 201. The wafer 208 on the unloader 204 is transferred by the wafer charger 206 onto the front lid as a wafer holder too of the carrier 209 that has previously been prepared at a wafer exit port 207 of the clean box 202. The front lid holding the processed wafer 208 thereon is fixed to the body of the carrier 209 in close contact relation using any suitable parts such as clips, and then pushed onto a slide guide 210 mounted at the wafer exit port 207 of the clean box 202 for transportation to the next step. In this connection, since the front lid 73 of the carrier 209, serving also as a wafer holder, is fixed and removed to and from the carrier body using the parts such as clips, any suitable mechanism for fitting and removing the clips is provided within the clean box 202. There is further provided a mechanism necessary for fixedly gripping the front lid during the time the front lid is withdrawn from the carrier body and moved within the clean box 202 for transfer of the wafer. Meanwhile, after taking out and sending the wafer to the equipment 201 for processing, the wafer holder and the body of the vacant carrier 209 are fixedly assembled again and removed from the wafer receive port 206 while the wafer 208 is being subjected to processing. Thereafter, the carrier 209 is loaded to the wafer exit port 207 in timing with the completion of wafer processing. Such interval time is varied in a range of about 1 minute to about 120 minutes. Alternatively, the carrier 209 can be used in such a manner that it is loaded into the wafer receive port 206 in the reversed orientation with the front lid as a wafer holder too lying at the back end. In this case, the wafer charger 205 is required to fetch the wafer 208 in the carrier 209, and hence the wafer gripper of the wafer charger 205 has to be accurately positioned in order to prevent scratching or chipping of wafers. By providing a wafer transfer unit having such a mechanism, wafer transfer interfaces can be standardized. As a result, it becomes possible to achieve highly universal wafer management irrespective of different types of processing equipments.

FIG. 34 is an overview of a production line constructed using the carriers of the present invention. This figure is illustrated as mainly focusing equipments constituting a certain process. A carrier 209 sent from the preceding process to the relevant process has an identification code affixed thereto, which is automatically read by a carrier reader 230. The identification code consists of the name of product group and the lot number for identifying each carrier and, for example, it is formed of a bar code tag, IC card, compact magnetic disc, etc. which can be read in a contactless manner. As a result of decoding the identification code thus read, if it is determined that the wafers requires to be process in the relevant process, a pusher 229 is actuated to branch to carrier 209 from the inter-process transporter equipment 227 to an inter-equipment transporter equipment 225. If there is no need of processing the wafers in the relevant process, the carrier 209 is directly sent to the succeeding process. The carrier 209 branched to the inter-equipment transporter equipment 225 of the relevant process is stored in one of storage boxes 224 classified by product group and process group by means of a pusher 229. At this time, carriers are stored for each of product groups in order of processing them in the relevant process. When selecting any one carrier 209 to be processed by the equipment 221, it is preferable to select such a carrier as corresponding to one having the minimum quantity of inventory in the succeeding process among the carriers classified by product group and process group, for example. The relevant carrier 209 can be shifted onto the inter-equipment transporter equipment 225 by vertically moving the storage boxes 224 classified by product group and process group by means of an elevation mechanism so that the relevant storage box is kept at the same level as the inter-equipment transporter equipment 225, and then pushing the carrier 209 toward the transporter equipment 225. The pushed-out carrier 209 is conveyed to a wafer transfer unit 222 through a carrier bringing-in device 231. After loading of the wafer to the processing equipment, the carrier 209 is closed by its lid and kept in a carrier buffer 223 dedicated for vacant carriers during the time the wafer is being processed by the equipment 221. Thereafter, for holding and storing the wafer having been processed, the same carrier is selected from the carrier buffer 223 and loaded into the wafer transfer unit 222 through the carrier bringing-out device 232. The carrier buffer 223 also has an elevation mechanism similar to that equipped in the storage boxes 224 classified by product group and process group. The carrier 209 having the wafer held and stored therein is transported through the interequipment transporter equipment 225, and then joined to the inter-process transporter equipment 227 by a junction device 226 for transportation to the next process. Thus, by making use of the carrier 209, it is possible to flexibly supply the wafers in different numbers for individual equipments, with the result that the processing waiting time can be minimized. Further, since the foregoing construction can be arranged for each of necessary processes in a like manner, it is also possible to perform rational wafer management throughout the production line.

Figure 35:
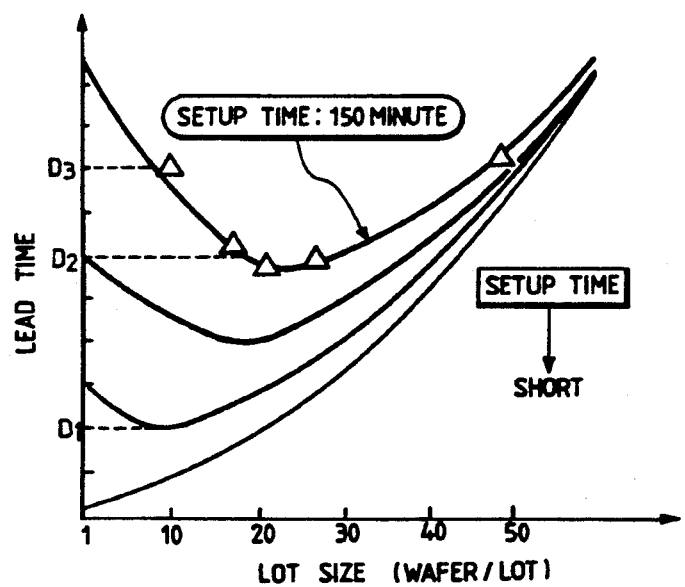
FIG. 35 is a graph showing the effect of shortening the period of production time by utilizing the carriers.

FIG. 35 is a graph showing the relationship between the lot size and the period of production time in a semiconductor production line. Effects of variation in the lot size on the period of production time (lead time) are indicated by marks Δ as per the case of evaluation a certain line arrangement. As will be found, while the period of production becomes shortest (as indicated by D2) with the lot size of 20-25 wafers, it is prolonged (as indicated by D3) inversely proportion to the lot size reducing gradually from the D2 point. This is attributable to the fact that some equipment becomes a neck in the production line. Therefore, assuming that the relevant equipment is subjected to a countermeasure for the neck (a measure to shorten a setup time in most cases), it will be appreciated that the period of production time can be curtailed (as indicated by D1) by gradually reducing the lot size.

Thus, since the lot size requires to be flexibly match with the processing capacity sizes of different equipments at the present time the equipments are being improved day by day, there is increasing needs for a production system using single-wafer cassettes.

According to the foregoing embodiments of the present invention, the arbitrary number of wafers can be transported and stocked as a set using the carrier jigs suitable for transporting and stocking wafer-like materials throughout the semiconductor manufacture processes. Such carrier jigs are suitable as universal implements for stocking and transporting wafers among the equipments with capability of processing the different numbers of wafers from each other. Further, since the wafer carrier jigs can be prepared corresponding to the optimum lot size in the manufacture processes, it is expected to shorten the period of production time and enhance the production speed.

At the time of taking out and storing wafers, the lid of the jig, serving also as a wafer holder, is separated from the jig body, and hence a working space for handling wafers is secured sufficiently. Therefore, workability can be improved and wafers are damaged less frequently. This further facilitates automization of wafer handling.

With the lids and the jib body enclosedly fitted to each other, wafers in the carrier jigs can surely be protected from contamination due to the working atmosphere and air-born dust during transportation and storage. It is therefore expected that the yield can be improved and a work area necessary for cleaning in the conventional clean area can be minimized.

Further, since the carrier body has two opening portions in the opposite surfaces, the capability of cleaning the inner surfaces of the carrier body is enhanced enough to eliminate the chance that nay particles will remain within the carrier body even after cleaning.

Since the carrier has the holder portion which can naturally hold a wafer on either one of two lids for enclosing the respective opening portions of the carrier body, the wafer will not be rattled due to vibrations in spite of transporting the carrier with the wafer stored therein. Thus, the wafer can be prevented from being damaged during transportation.

Moreover, when taking a wafer into and out of the carrier, the lid provided with the holder portion can directly be handled by the wafer transfer unit, so that it is less frequently required to transfer the wafer itself, which may tend to cause damage of the wafer and adherence of particles onto the wafer.

Since the wafer can selectively be taken into and out of the carrier through either of two lids, it is possible to transfer the wafer in harmony with the peripheral equipments with higher flexibility.

In addition, since the present semiconductor production system includes carriers each of which has an opening portion and is formed in the peripheral walls of the opening portion with wafer storage grooves for storing a few, e.g., one to three, wafers with gaps left therebetween, and based each having a recessed portion, the carriers and the bases being constructed to be capable of superimposing one above another, it becomes possible to achieve the effects of improving respective efficiency and workability of transportation, storage and stock of wafers among and in the equipments with the capability of processing different numbers of wafers, and preventing wafers from contamination during transportation, storage and stock of the wafers.

Also, since the present semiconductor production system includes a plurality of carriers, and a container box for loading therein a carrier assembly consisted of the plural carriers superimposed and interconnected together, each of the carriers being constructed such that the carrier is formed in its inner side walls with wafer storage grooves for storing a few, e.g., one to three, wafers with gaps left therebetween, that the carrier is formed to have such an outer configuration as allowing the carrier to be hooked between the inner walls of the cleaning tank, that the carrier is provided with the connectors for interconnecting the plural carriers superimposed one above another, and that the interior of the carrier is formed to restrict the occurrence of turbulence of a cleaning solution at the wafer surfaces during the step of cleaning, there can be obtained the effect that the carrier can effectively be used as a cleaning jig too, in addition to the foregoing effects.

Furthermore, since the present semiconductor production system comprises a main lot transporter line, an equipment for processing a lot consisted of plural wafers, a lot cleaning equipment, a lot inspection equipment, a plurality of shops having an intra-shop conveyer for transporting the lot among those equipments and disposed around the main lot transporter line, multistations each having a plurality of stations adapted to temporarily stock the lot therein and disposed corresponding to the shops one-to-one relation, lot transporter equipments for transporting the lot among the main lot transporter line, the multistations and the shops, a plurality of branch or junction equipments provided in each of the multistations for transferring the lot between the lot transporter equipments, a plurality of sensors disposed corresponding to the respective stations of each multistation for recognizing the type and the processed state of the lot, and a controller for processing the recognized results of the sensors and sending commands to the required points, there can be obtained the effect of manufacturing semiconductors by repeatedly applying the processing predetermined for each product group to lots of various product groups.

Finally, since the present manufacture production system comprises multistations each having a plurality of stations adapted to temporarily stock the lot therein and disposed corresponding to the shops one-to-one relation, a plurality of sensors disposed corresponding to the respective stations of each multistation for recognizing the type and the processed state of the lot, and a controller for processing the recognized results of the sensors, controlling at least the branch or junction equipments provided in each of the multistations, and adjusting the amount of lots delivered from the multistation of the preceding processing shop so that the quantities of inventory of lots in every two shops adjacent to each other in the process line have respective proper values, there can be obtained the effect of smoothly controlling a flow of lots corresponding to respective product groups, and implementing the production line as a flexible production line, even in case of processing lots of many product groups.

What is claimed is:

1. A production system comprising:
   transporting means for transporting works between at least two of a plurality of processing means;
   a jig having,
   a carrier for holding each of a plurality of works, the carrier having an opening means in one direction for loading and unloading said works, and peripheral walls in three other directions thereof having work storage grooves for storing the plurality of works with gaps left therebetween, and bases having a projected and a recessed portion, constructed to be capable of superimposing a plurality of said carriers one above another, wherein said carrier is transported on said transporting means,
   a container means for containing said works in said carrier, and
   first means for selectively supplying each of said works from said jig to one of said processing means for processing and for storing said works after processing;
   buffering means for temporarily holding the plurality of said works as a plurality of product groups, to be transported by said transporting means;
   identifying means for identifying a product group to which each of said works belongs;
   determining means for determining an order of transporting each of said plurality of words held in said buffering means in accordance with an identification of said works; and
   interface means for supplying said plurality of product groups held in said buffering means to said transporting means according to the order determined by said determining means.

* * * * *